(12) United States Patent
Im et al.

(10) Patent No.: US 9,780,113 B2
(45) Date of Patent: Oct. 3, 2017

(54) METHOD FOR FABRICATING SEMICONDUCTOR DEVICE INCLUDING A FIRST ILD WITH SLOPED SURFACE ON A STACKED STRUCTURE AND A SECOND ILD ON THE FIRST ILD

(71) Applicants: Jiwoon Im, Hwaseong-si (KR); Kwangchul Park, Suwon-si (KR); Jiyoun Seo, Seoul (KR); Jongmyeong Lee, Seongnam-si (KR); Kyung-Tae Jang, Seoul (KR); Byungho Chun, Seongnam-si (KR); Won-Seok Jung, Anyang-si (KR); Jongwan Choi, Suwon-si (KR); Tae-Jong Han, Seoul (KR)

(72) Inventors: Jiwoon Im, Hwaseong-si (KR); Kwangchul Park, Suwon-si (KR); Jiyoun Seo, Seoul (KR); Jongmyeong Lee, Seongnam-si (KR); Kyung-Tae Jang, Seoul (KR); Byungho Chun, Seongnam-si (KR); Won-Seok Jung, Anyang-si (KR); Jongwan Choi, Suwon-si (KR); Tae-Jong Han, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/963,803

(22) Filed: Dec. 9, 2015

(65) Prior Publication Data
US 2016/0233232 A1 Aug. 11, 2016

(30) Foreign Application Priority Data

Feb. 10, 2015 (KR) .................. 10-2015-0020259

(51) Int. Cl.
*H01L 21/336* (2006.01)
*H01L 27/11582* (2017.01)
(Continued)

(52) U.S. Cl.
CPC .. *H01L 27/11582* (2013.01); *H01L 21/76837* (2013.01); *H01L 27/1157* (2013.01); *H01L 27/11575* (2013.01)

(58) Field of Classification Search
None
See application file for complete search history.

(56) References Cited

U.S. PATENT DOCUMENTS 5,336,640 A * 8/1994 Sato .................. C23C 16/345
257/E21.275
7,679,133 B2 3/2010 Son et al.
(Continued)

FOREIGN PATENT DOCUMENTS

JP 3620520 B2 2/2005
JP 3651689 B2 5/2005
(Continued)

*Primary Examiner* — Cory Eskridge
(74) *Attorney, Agent, or Firm* — Harness, Dickey & Pierce, P.L.C.

(57) ABSTRACT

A method for fabricating a semiconductor device includes forming a stacked structure on a substrate, forming a first interlayer dielectric covering the stacked structure, and forming a second interlayer dielectric covering the first interlayer dielectric. The stacked structure includes a step-wise shape. The first interlayer dielectric includes at least one step portion having a slope surface connecting a first top surface to a second top surface. The first top surface and the sloped surface define a first angle that is an obtuse angle. A level of the second top surface is higher than a level of the first top surface.

20 Claims, 28 Drawing Sheets

(51) Int. Cl.
*H01L 27/1157* (2017.01)
*H01L 27/11575* (2017.01)
*H01L 21/768* (2006.01)

(56) References Cited

U.S. PATENT DOCUMENTS

| | | | |
|---|---|---|---|
| 7,989,880 B2 | 8/2011 | Wada et al. | |
| 8,304,348 B2 * | 11/2012 | Hashimoto | H01L 27/11578 |
| | | | 438/618 |
| 8,553,466 B2 | 10/2013 | Han et al. | |
| 8,559,235 B2 | 10/2013 | Yoon et al. | |
| 8,564,050 B2 | 10/2013 | Park et al. | |
| 8,569,182 B2 | 10/2013 | Park et al. | |
| 8,654,587 B2 | 2/2014 | Yoon et al. | |
| 8,722,474 B2 | 5/2014 | Yoon et al. | |
| 2008/0093714 A1 | 4/2008 | Kim | |
| 2011/0147824 A1 | 6/2011 | Son et al. | |
| 2011/0233648 A1 | 9/2011 | Seol et al. | |
| 2012/0108048 A1 * | 5/2012 | Lim | H01L 27/11529 |
| | | | 438/586 |
| 2015/0255386 A1 * | 9/2015 | Lee | H01L 23/5226 |
| | | | 257/774 |

FOREIGN PATENT DOCUMENTS

| | | |
|---|---|---|
| JP | 5305980 B2 | 10/2013 |
| KR | 10-0497206 B1 | 6/2005 |
| KR | 10-0819001 B1 | 4/2008 |
| KR | 20110015338 A | 2/2011 |
| KR | 2011-0068590 A | 6/2011 |
| KR | 2012-0053329 A | 5/2012 |
| KR | 2013-0036947 A | 4/2013 |
| KR | 2014-0030460 A | 3/2014 |

* cited by examiner

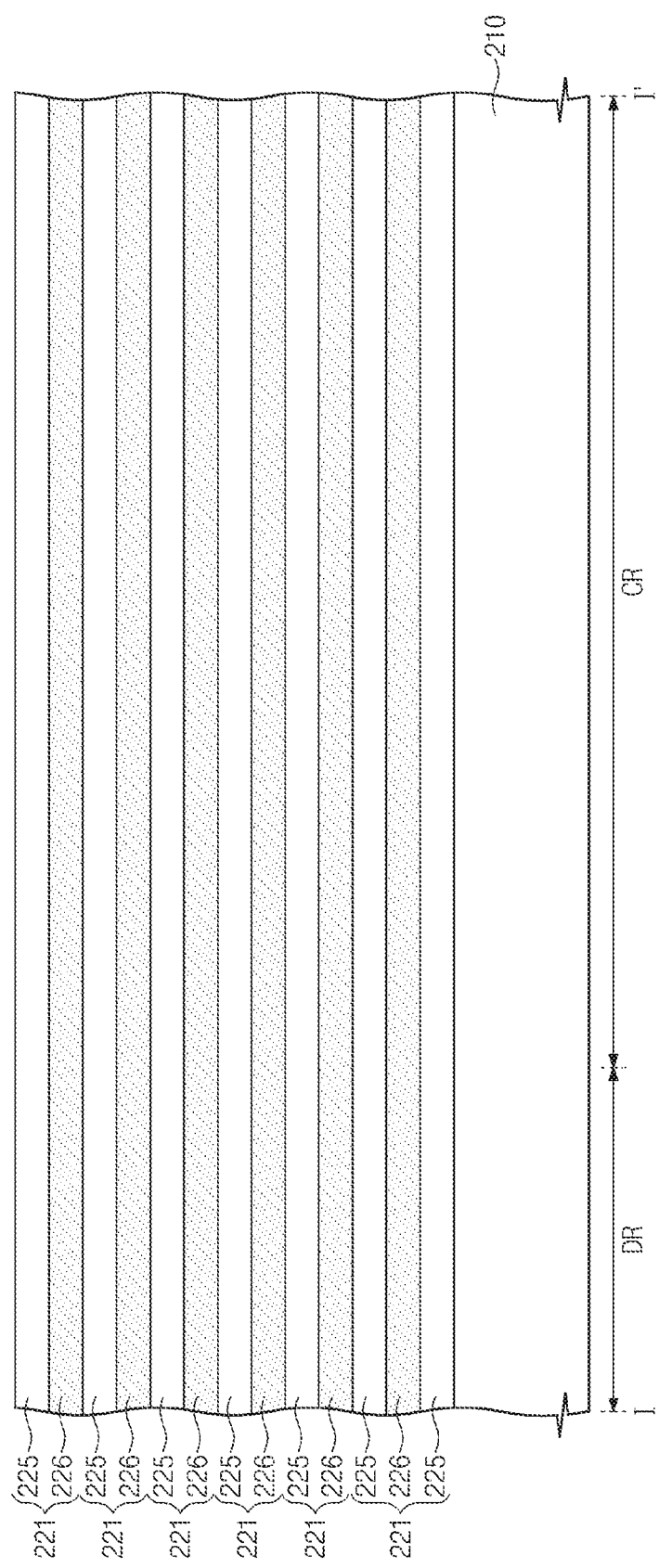

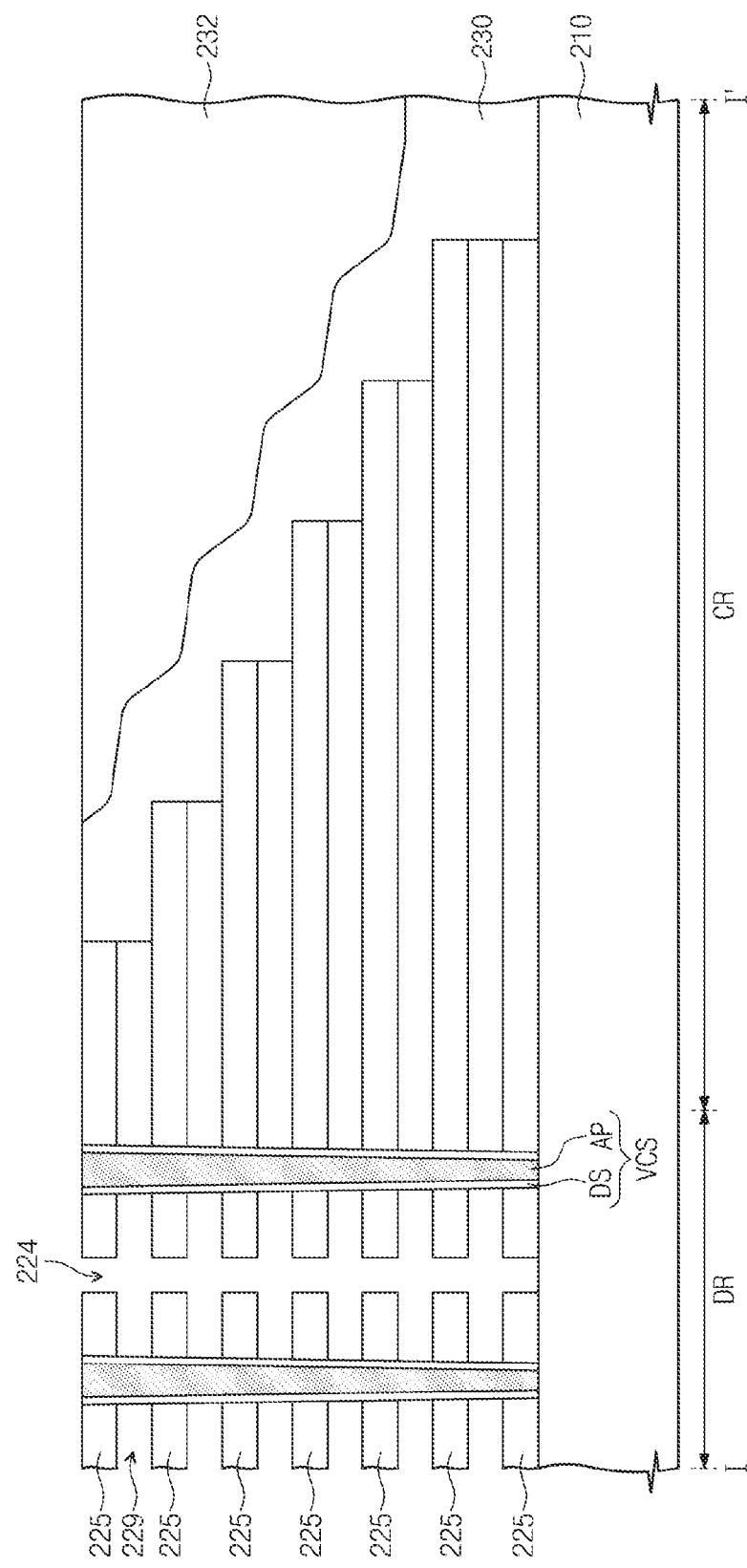

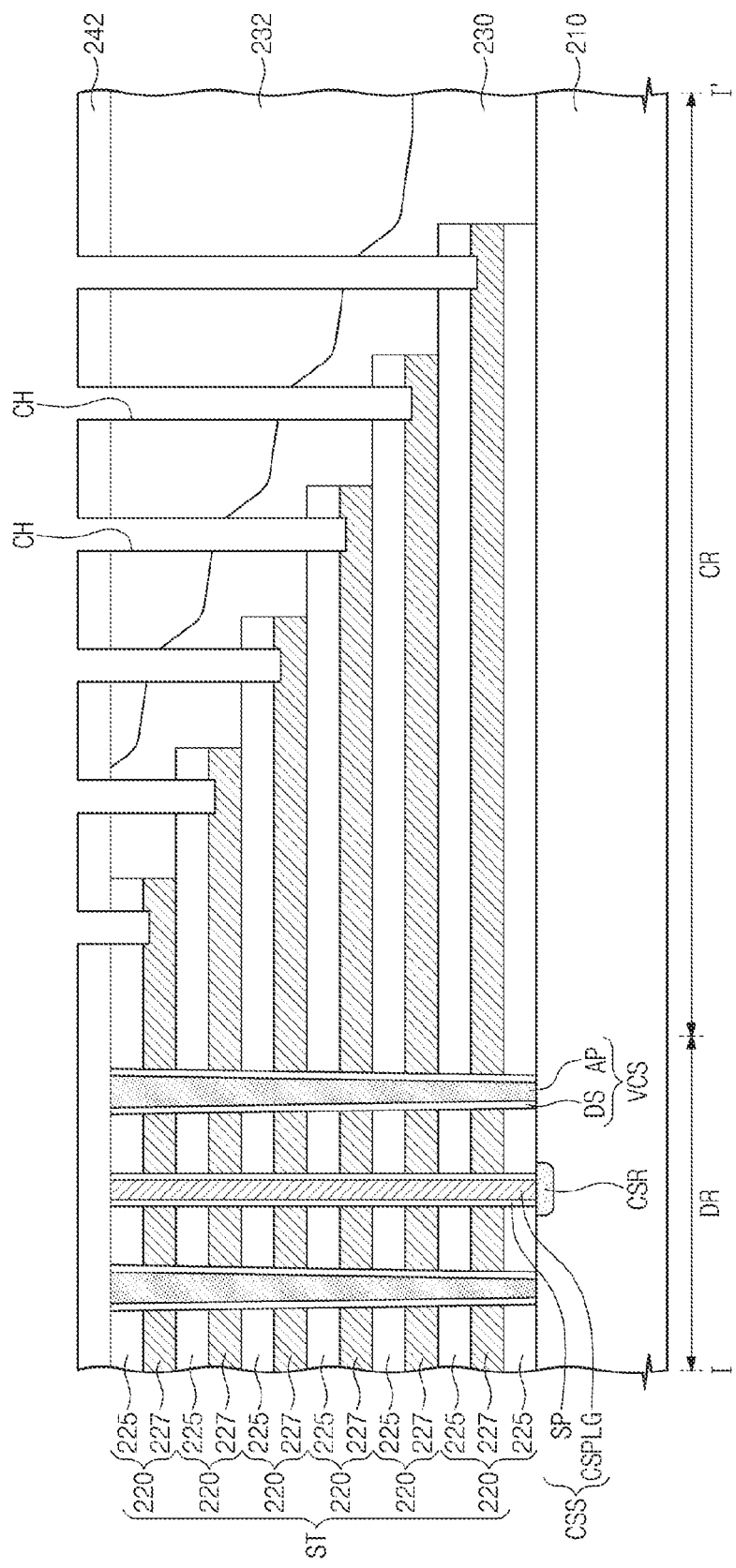

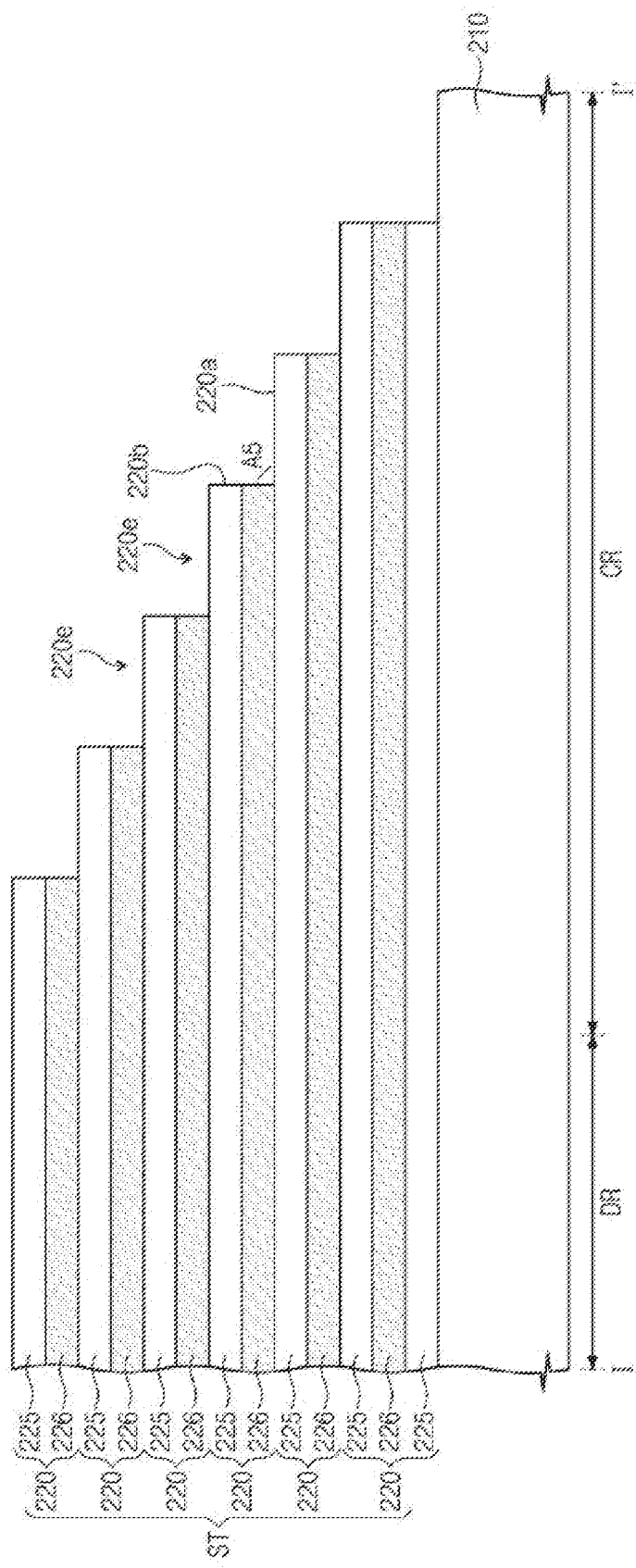

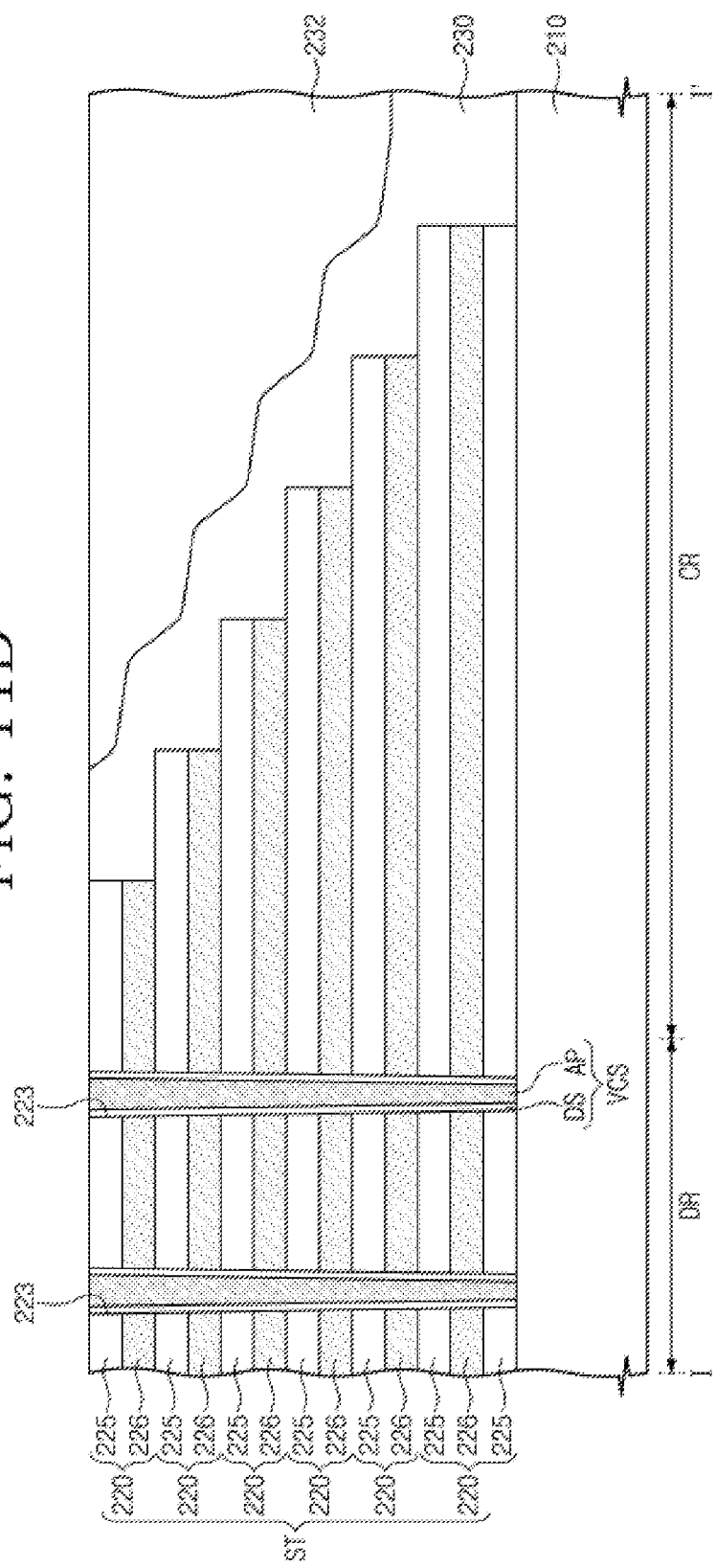

METHOD FOR FABRICATING SEMICONDUCTOR DEVICE INCLUDING A FIRST ILD WITH SLOPED SURFACE ON A STACKED STRUCTURE AND A SECOND ILD ON THE FIRST ILD

CROSS-REFERENCE TO RELATED APPLICATIONS

This US non-provisional patent application claims priority under 35 USC §119 to Korean Patent Application No. 10-2015-0020259, filed on Feb. 10, 2015, the entirety of which is hereby incorporated by reference.

BACKGROUND

The present disclosure relates to semiconductor devices and methods for fabricating the same and, more particularly, to a semiconductor device including an insulating layer formed on a lower structure having a stepwise shape and a method for fabricating the semiconductor device.

Electronic products may have smaller sizes while processing high-capacity data. Accordingly, the integration density of some semiconductor memory devices used in such electrical products has increased. As an attempt to improve integration density of semiconductor memory devices, a nonvolatile memory device having a vertical transistor structure instead of an existing flat transistor structure has been proposed. A nonvolatile memory device having such a vertical transistor structure may include a stacked structure having a stepwise shape and an interlayer dielectric to cover the stacked structure.

SUMMARY

The present disclosure relates to a nonvolatile memory system and/or an operating method of the nonvolatile memory system.

According to example embodiments, a method for fabricating a semiconductor device may include: forming a stacked structure on a substrate, forming a first interlayer dielectric covering the stacked structure, and forming a second interlayer dielectric covering the first interlayer dielectric. The stacked structure includes a stepwise shape. The first interlayer dielectric includes at least one step portion having a sloped surface connecting a first top surface to a second top surface. A level of the second top surface is higher than a level of the first top surface. The first top surface and the sloped surface define a first angle that is an obtuse angle.

In example embodiments, the forming stacked structure may include forming a plurality of step layers on the substrate. The forming the plurality of step layers may include forming at least a first step layer and a second step layer stacked sequentially. The first step layer may include an end portion exposed by the second step layer, and the second step layer may include a side surface adjacent to the end portion of the first step layer. A second angle may be defined by a top surface of the end portion of the first step layer and the side surface of the second step layer. The second angle may be smaller than the first angle.

In example embodiments, the second angle may be between 85 and 95 degrees.

In example embodiments, the sloped surface may horizontally correspond to the side surface of the second step layer.

In example embodiments, the first top surface and the second top surface may be sloped with respect to a top surface of the substrate.

In example embodiments, the first angle may be between 100 and 150 degrees.

In example embodiments, the method may further include forming a vertical channel structure penetrating the first step layer and the second step layer on a device region of the substrate. The substrate may include the device region and a connection region. The forming the plurality of step layers may include forming the first step layer and the second step layer on the device region and the connection region. The forming the stacked structure may include forming the stacked structure so the stepwise shape is on the connection region.

In example embodiments, the method may further include forming a first contact and forming a second contact. The forming the plurality of step layers may include forming the first step layer by sequentially stacking a first electrode and a first electrode insulating layer. The forming the plurality of step layers may include forming the second step layer by sequentially stacking a second electrode and a second electrode insulating layer. The forming the first contact may include electrically connecting the first contact to the first electrode by forming the first contact to penetrate the first interlayer dielectric, the second interlayer dielectric, and the first electrode insulating layer on the connection region. The forming the second contact may include electrically connecting the second contact to the second electrode by forming the second contact to penetrate the first interlayer dielectric, the second interlayer dielectric, and the second electrode insulating layer on the connection region.

A method for fabricating a semiconductor device according to example embodiments of inventive concepts may include forming a stacked structure on a substrate, forming a first interlayer dielectric covering the stacked structure using a deposition process with a side step coverage of greater than 0 percent and less than or equal to 50 percent, and forming a second interlayer dielectric covering the first interlayer dielectric. The stacked structure includes a stepwise shape. The stacked structure includes a plurality of step layers.

In example embodiments, the forming the first interlayer dielectric may include performing a high-density plasma chemical vapor deposition process using silane (SiH4) gas.

In example embodiments, the forming the second interlayer dielectric may include performing a deposition process with a higher side step coverage than that of the deposition process for the first interlayer dielectric.

In example embodiments, the forming the second interlayer dielectric may include performing a plasma enhanced chemical vapor deposition process using tetraethoxysilane (TEOS) gas.

In example embodiments, the first interlayer dielectric includes at least one step portion having a sloped surface connecting a first top surface to a second top surface. A level of the second top surface may be higher than a level of the first top surface. The first top surface and the sloped surface may define a first angle that is between 100 and 150 degrees.

In example embodiments, the substrate may include a device region and a connection region. The forming the stacked structure may include sequentially forming a first step layer and a second step layer on the substrate, forming the stepwise shape by removing a portion of the second step layer on the connection region and exposing a portion of a top surface of the first step layer, and forming vertical channel structures penetrating the plurality of step layers on the device region. The exposed top surface of the first step layer and a side surface of the second step layer may define a second angle that is between 85 and 95 degrees.

In example embodiments, the method may further include forming a first and a second contact hole, and forming a first and a second contact. The forming the first step layer may include forming a first electrode and a first electrode insulating layer stacked sequentially. The forming the second step layer may include forming a second electrode and a second electrode insulating layer stacked sequentially. The forming the first contact hole and the second contact hole may include: forming the first contact hole through the first interlayer dielectric, the second interlayer dielectric, and the first electrode insulating layer to expose a top surface of the first electrode on the connection region; and forming the second contact hole through the first interlayer dielectric, the second interlayer dielectric, and the second electrode insulating layer to expose a top surface of the second electrode on the connection region. The forming the first contact and the second contact may include filling the first contact hole and the second contact hole with the first contact and the second contact, respectively.

According to example embodiments, a method for fabricating a semiconductor device includes forming stacked structure on a substrate and forming a plurality of interlayer dielectrics on the stacked structure. The stacked structure includes a plurality of step layers stacked on top of each other. An end of the stacked structure has a stepwise shape defined by the step layers extending farther parallel to the substrate as the step layers become closer to the substrate. The forming the plurality of interlayer dielectrics includes forming a first interlayer dielectric covering at least the end of the stacked structure and having a first side step coverage over the end of the stacked structure. The forming the plurality of interlayer dielectrics includes forming a second interlayer dielectric covering at least the first interlayer dielectric and the end of the stacked structure. The second interlayer dielectric has a second side step coverage over the end of the stacked structure that is greater than the first side step coverage.

In example embodiments, the forming the first interlayer dielectric may include performing a high-density plasma chemical vapor deposition process using silane (SiH4) gas.

In example embodiments, the forming the second interlayer dielectric may include performing a plasma enhanced chemical vapor deposition process using tetraethoxysilane (TEOS) gas.

In example embodiments, the first interlayer dielectric may include at least one step portion having a sloped surface of the first interlayer dielectric connecting a first top surface of the first interlayer dielectric to a second top surface of the first interlayer dielectric. A level of the second top surface may be higher than a level of the first top surface. The first top surface and the sloped surface may define a first angle that is between 100 and 150 degrees.

In example embodiments, the method may further include forming one or more vertical channel structures penetrating the step layers on a device region of the substrate, and forming bit lines connected to the one or more vertical channel structures. The substrate may include the device region and a connection region. The forming the stacked structure may include forming the stacked structure so the end of the stacked structure having the stepwise shape is on the connection region. The step layers may each include an electrode layer on an electrode insulating layer. Each of the vertical channel structures may include an active pillar surrounded by a data storage layer. The data storage layer may extend between the active pillar and the step layers.

BRIEF DESCRIPTION OF THE DRAWINGS

The forgoing and other features of inventive concepts will be described below in more detail with reference to the accompanying drawings of non-limiting embodiments of inventive concepts in which like reference characters refer to like parts throughout the different views. The drawings are not necessarily to scale, emphasis instead being placed upon illustrating principles of inventive concepts. In the drawings:

FIGS. 7A to 7M are cross-sectional views each corresponding to the line I-I' in FIG. 5 and illustrate a method for fabricating a semiconductor device according to example embodiments of inventive concepts;

FIGS. 11A to 11D illustrate a method for fabricating a semiconductor device according to example embodiments of inventive concepts.

DETAILED DESCRIPTION

Figure 1:
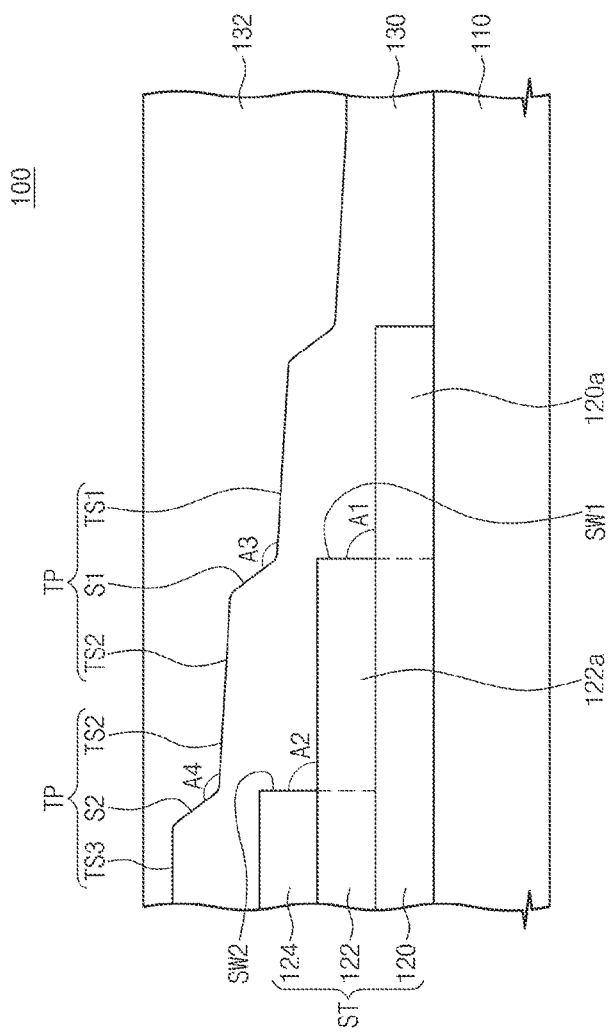
FIG. 1 is a cross-sectional view of a semiconductor device according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. Like reference characters and/or numerals in the drawings denote like elements, and thus their description may not be repeated.

In the specification, it will be understood that when an element is referred to as being "on" another layer or substrate, it can be directly on the other element, or intervening elements may also be present. In the drawings, thicknesses of elements are exaggerated for clarity of illustration. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, example embodiments of inventive concepts will now be described more fully with reference to accompanying drawings.

FIG. 1 is a cross-sectional view of a semiconductor device 100 according to example embodiments of inventive concepts. As illustrated, the semiconductor device 100 includes a substrate 110, a stacked structure ST, a first interlayer dielectric 130, and a second interlayer dielectric 132.

The substrate 110 may be a semiconductor substrate. The semiconductor substrate may include at least one selected from the group consisting of, for example, a single-crystalline silicon layer, a silicon layer formed on silicon-germanium (SiGe) layer, a silicon single-crystalline layer formed on an insulating layer, and a polysilicon layer formed on an insulating layer.

The stacked structure may be disposed on the substrate 110. The stacked structure ST may include a first step layer 120, a second step layer 122, and a third step layer 124 that are stacked in the order named. The first step layer 120 may include a first end portion 120a exposed by the second step layer 122, and the second step layer 122 may include a second end portion 122a exposed by the third step layer 124. The first end portion 120a and the second end portion 122a may be disposed at one side of the stacked structure ST and, accordingly the one side of the stacked structure ST may have a stepwise shape. The second step layer 122 may have a first side surface SW1 adjacent to a top surface of the first end portion 120a, and the third step layer 124 may have a second side surface SW2 adjacent to a top surface of the second end portion 122a. In example embodiments, an angle A1 formed by the top surface of the first end portion 120a and the first side surface SW1, and an angle A2 formed by the top surface of the second end portion 122a and the second side surface SW2 may each be between 85 and 95 degrees. In example embodiments, each of the angles A1 and A2 may be a substantially right angle. Each of the first, second, and third step layers 120, 122, and 124 may be an insulating layer, a conductive layer or a multi-layered structure in which insulating layers and conductive layers are alternately stacked.

The first interlayer dielectric 130 may cover the stacked structure ST. Accordingly, the first end portion 120a, the second end portion 122a, the first side surface SW1, and the second side surface SW2 may be covered with the first interlayer dielectric 130. The first interlayer dielectric 130 may have a first top surface TS1, a second top surface TS2 disposed at a higher level than the first top surface TS1, a third top surface TS3 disposed at a higher level than the second top surface TS2, a first sloped surface S1 connecting the first top surface TS1 and the second top surface TS2 to each other, and a second sloped surface S2 connecting the second top surface TS2 and the third top surface TS3 to each other. Accordingly, the first interlayer dielectric 130 may have a plurality of step portions TP.

Each of the step portions TP may include one top surface, another top surface disposed at a higher level than the one top surface, and a sloped surface connecting the top surfaces to each other. For example, the step portions TP may include a step portion TP including a first top surface TS1, a second top surface TS2, and a first sloped surface S1, and another step portion TP including a second top surface TS2, a third top surface TS3, and a second sloped surface S2. When viewed from the top, the first top surface TS1 may overlap the first end portion 120a, the second top surface TS2 may overlap the second end portion 122a, and the third top surface TS3 may overlap the third step layer 124. Accordingly, the first sloped surface S1 may be disposed adjacent to the first side surface SW1 to horizontally correspond to the second side surface SW2.

Each of the first and second top surfaces TS1 and TS2 may be sloped with respect to a top surface of the substrate 110. An angle A3 formed by the first top surface TS1 and the first sloped surface S1 may be greater than the angle A1 formed by the top surface of the first end portion 120a and the first side surface SW1, and an angle A4 formed by the second top surface TS2 and the second sloped surface S2 may be greater than the angle A2 formed by the top surface of the second end portion 122a and the second side surface SW2. Each of the angles A3 and A4 may be an obtuse angle. For example, each of the angles A3 and A4 may be between 100 and 150 degrees. In example embodiments, each of the angles A3 and A4 may be between 110 and 150 degrees. The first interlayer dielectric 130 may include, for example, silicon oxide. In example embodiments, the first interlayer dielectric 130 may include at least one of silicon nitride and silicon oxynitride.

The second interlayer dielectric 132 may cover the first interlayer dielectric 130. The second interlayer dielectric 132 may include, for example, silicon oxide.

FIGS. 2A to 2D are cross-sectional views illustrating a method for fabricating a semiconductor device according to example embodiments of inventive concepts. For concise description, such a previously described element may be identified by a similar or identical reference number without repeating duplicating descriptions thereof.

Figure 2A:
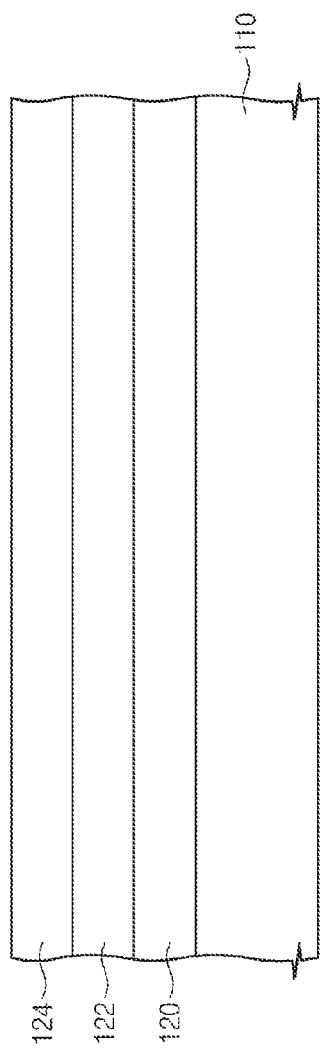
FIGS. 2A to 2D are cross-sectional views illustrating a method for fabricating a semiconductor device according to example embodiments of inventive concepts.

Referring to FIG. 2A, a first step layer 120, a second step layer 122, and a third step layer 124 may be sequentially formed on a substrate 110. Each of the first, second, and third step layers 120, 122, and 124 may be an insulating layer, a conductive layer or a multi-layered structure in which insulating layers and conductive layers are alternately stacked. The first, second, and third step layers 120, 122, and 124 may be formed by a deposition process. For example, the first, second, and third step layers 120, 122, and 124 may be formed by one of a physical vapor deposition (PVD) process, a chemical vapor deposition (CVD) process, and an atomic layer deposition (ALD) process.

Figure 2B:
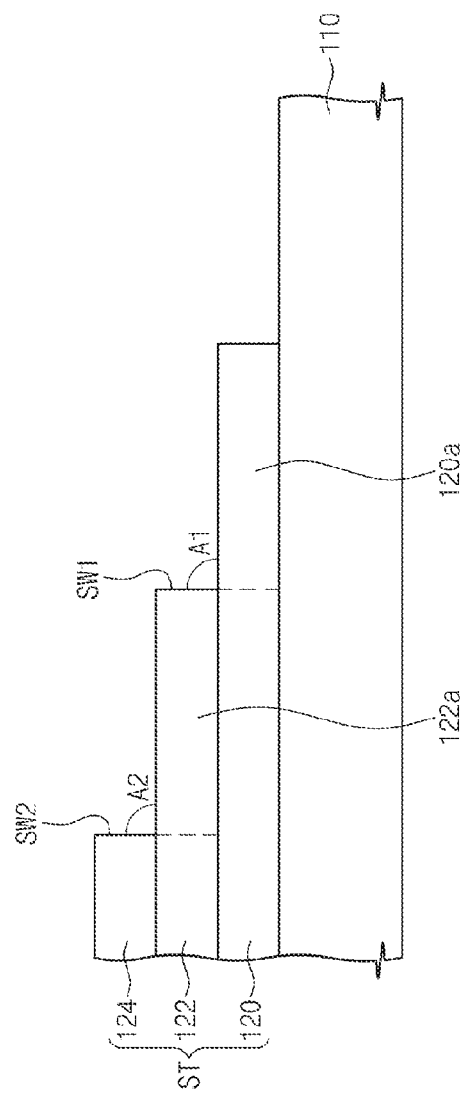

Referring to FIG. 2B, the first step layer 120, the second step layer 122, and the third step layer 127 may be partially etched to form a stacked structure ST having a stepwise shape. The stacked structure ST may include the first step layer 120, the second step layer 122, and the third step layer 124. The first step layer 120 may have a first end portion 120a exposed by the second step layer 122, and the second step layer may have a second end portion 122a exposed by the third step layer 124. The second step layer 122 may have a first side surface SW1 adjacent to a top surface of the first end portion 120a, and the third step layer 124 may have a second side surface SW2 adjacent to a top surface of the second end portion 122a. In example embodiments, an angle A1 formed by the top surface of the first end portion 120a and the first side surface SW1, and an angle A2 formed by the top surface of the second end portion 122a and the second side surface SW2 may each be between 85 and 95 degrees. In example embodiments, each of the angles A1 and A2 may be a substantially right angle.

Figure 2C:
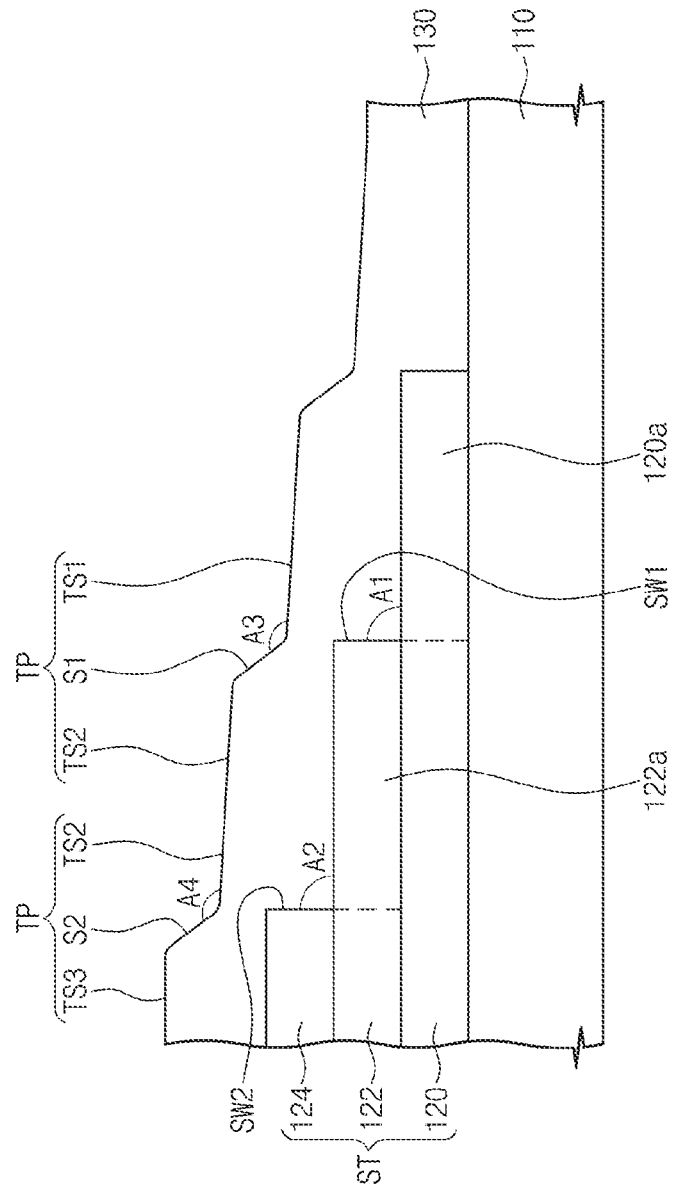

Referring to FIG. 2C, a first interlayer dielectric 130 may be formed to cover the stacked structure ST. Forming the first interlayer dielectric 130 may include performing a deposition process with a side step coverage of 50 percent or less. The term "side step coverage" means a value obtained, when a layer is deposited on a lower structure having a top surface and a side surface perpendicular to the top surface, by dividing a thickness of the layer deposited on the side surface by a thickness of the layer deposited on the top surface. In example embodiments, forming the first interlayer dielectric 130 may include performing a high-density plasma chemical vapor deposition (HDP CVD) process using a reactive gas containing silane ($SiH_4$) and oxygen ($O_2$).

The first interlayer dielectric 130 may be formed to have a first top surface TS1, a second top surface TS2 disposed at a higher level than the first top surface TS1, a third top surface TS3 disposed at a higher level than the second top surface TS2, a first sloped surface S1 connecting the first top surface TS1 and the second top surface TS2 to each other, and a second sloped surface S2 connecting the second top surface TS2 and the third top surface TS3 to each other. Accordingly, the first interlayer dielectric 130 may have a plurality of step portions TP. Each of the step portions TP may have one top surface, another top surface disposed at a higher level than the one top surface, and a sloped surface connecting the top surfaces to each other. For example, the step portions TP may include a step portion TP including a first top surface TS1, a second top surface TS2, and a first sloped surface S1 and another step portion TP including a second top surface TS2, a third top surface TS3, and a second sloped surface S2. When viewed from the top, the first top surface TS1 may overlap the first end portion 120a, the second top surface TS2 may overlap the second end portion 122a, and the third top surface TS3 may overlap the third step layer 124.

Accordingly, the first sloped surface S1 may be disposed adjacent to the first side surface SW1 to horizontally correspond to the second side surface SW2. Each of the first and second top surfaces TS1 and TS2 may be sloped with respect to a top surface of the substrate 110. An angle A3 formed by the first top surface TS1 and the first sloped surface S1 may be greater than the angle A1, and an angle A4 formed by the second top surface TS2 and the second sloped surface S2 may be greater than the angle A2. Each of the angles A3 and A4 may be an obtuse angle. For example, each of the angles A3 and A4 may be between 100 and 150 degrees. In example embodiments, each of the angles A3 and A4 may be between 110 and 150 degrees.

Figure 2D:
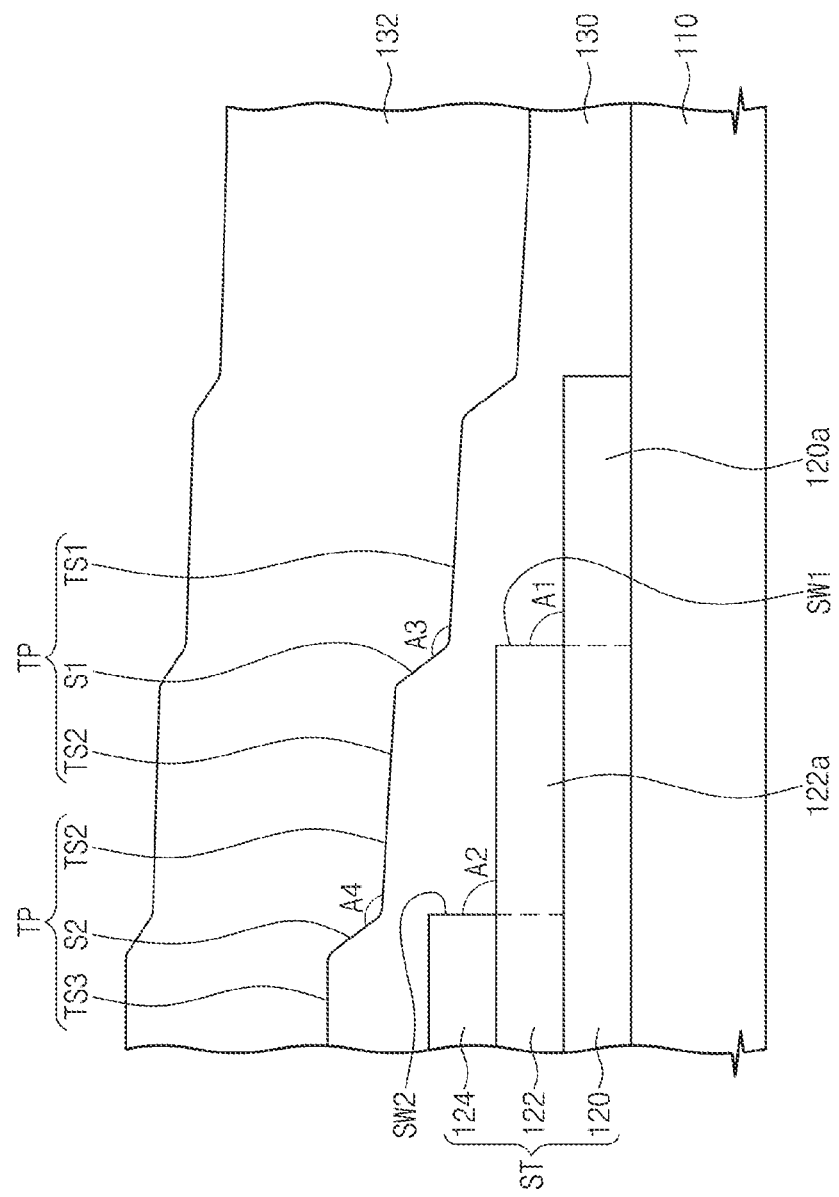

Referring to FIG. 2D, a second interlayer dielectric 132 may be formed to cover the first interlayer dielectric 130. Forming the second interlayer dielectric 132 may include performing a deposition process with a higher side step coverage than that of the deposition process for the first interlayer dielectric 130. For example, forming the second interlayer dielectric 132 may include performing a deposition process with a side step coverage of 70 percent or above. In example embodiments, forming the second interlayer dielectric 132 may include performing a plasma enhanced chemical vapor deposition (PE CVD) process using a reactive gas containing tetraethoxysilane (TEOS), oxygen ($O_2$), and/or nitrous oxide ($N_2O$). Since a top surface of the first interlayer dielectric 130 has a step difference, a top surface of the second interlayer dielectric 132 may also have a step difference.

Returning to FIG. 1, a planarization process may be performed. The planarization process may be performed using a chemical mechanical polishing (CMP) process.

When an interlayer dielectric is deposited on a stacked structure having a stepwise shape including a step portion where an angle formed by a top surface and a side surface is a substantially right angle, a portion of the interlayer dielectric deposited on the top surface and a portion of the interlayer dielectric deposited on the side surface may join to form a boundary, which is called "cusping". When the interlayer dielectric is formed using a deposition process with a high side step coverage, it becomes highly probable that the cusping is formed. When a cusping is formed, strength of an interlayer dielectric may get lower. Moreover, when contacts are formed through the interlayer dielectric in a subsequent process, a conductor may be formed along the cusping and accordingly, the contacts may be short-circuited to each other.

According to the above-described method for fabricating a semiconductor device, a first interlayer dielectric is formed on a stacked structure having a stepwise shape using a deposition process with a low side step coverage and a second interlayer dielectric is formed on the first interlayer dielectric using a deposition process with a higher side step coverage. The first interlayer dielectric may have a stepwise shape including step portions where an angle formed by a top surface and a side surface is an obtuse angle, because the first interlayer dielectric is formed using the deposition process with a low side step coverage. Since the second interlayer dielectric is formed on the first interlayer dielectric having the stepwise shape with the obtuse angle, cusping may be limited (and/or prevented). Thus, with the method for fabricating a semiconductor device according to example embodiments of inventive concepts, reliability and yield may be enhanced.

Figure 3:
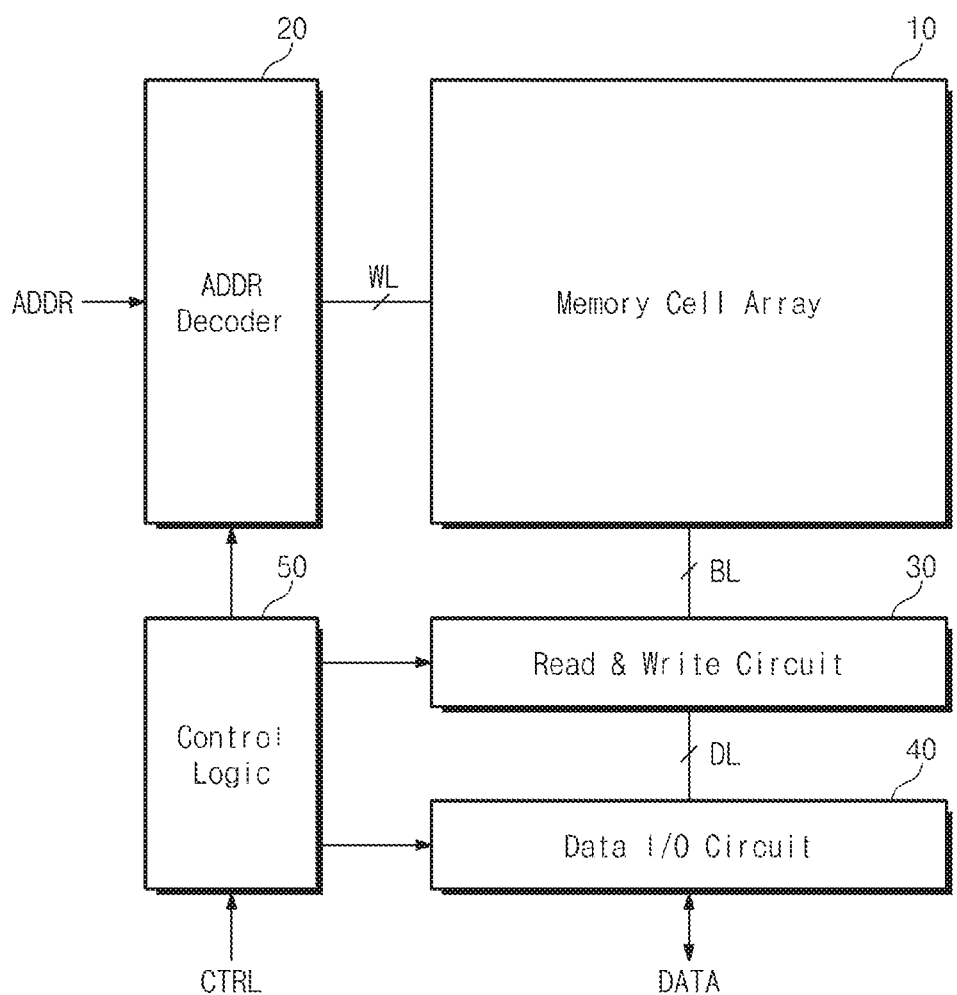
FIG. 3 is a block diagram of a semiconductor device according to example embodiments of inventive concepts.

FIG. 3 is a block diagram of a semiconductor device according to example embodiments of inventive concepts. As illustrated, the semiconductor device may include a memory cell array 10, an address decoder 20, a read/write circuit 30, a data input/output (I/O) circuit 40, and a control logic 50. The semiconductor device may be a memory device.

The memory cell array 10 may be connected to the address decoder 20 through a plurality of wordlines WL and connected to the read/write circuit 30 through a plurality of bitlines BL. The memory cell array 10 includes a plurality of memory cells. For example, the memory cell array 10 may be configured to store one or more bits per cell.

The address decoder 20 may be connected to the memory cell array 10 through the wordlines WL. The address decoder 20 is configured to operate in response to the control of the control logic 50. The address decoder 20 may externally receive an address ADDR. The address decoder 20 may decode a row address among the received address ADDR to select a corresponding one of the wordlines WL. The address decoder 20 decodes a column address among the received address ADDR and transmits the decoded column address to the read/write circuit 30. For example, the address decoder 120 may include well-known elements such as a row decoder to decode a row address, a column decoder, and an address buffer.

The read/write circuit 30 may be connected to the memory cell array 10 through the bit lines BL and connected to the data I/O circuit 40 through data lines DL. The read/write circuit 30 may operate in response to the control of the control logic circuit 50. The read/write circuit 30 is configured to receive the decoded column address signal. The read/write circuit 30 is configured to select a bitline BL using the decoded column address. For example, the read/write circuit 30 receives data from the data I/O circuit 40 and writes the received data into the memory cell array 10. The read/write circuit 30 reads data from the memory cell array 10 and transmits the read data to the data I/O circuit 40. The read/write circuit 30 reads data from a first storage area of the memory cell array 10 and may write the read data into a second storage area of the memory cell array 10. For example, the read/write circuit 30 may be configured to perform a copy-back operation.

The read/write circuit 30 may include components such as a page buffer (or a page register) and a column selection circuit. In example embodiments, the read/write circuit 30 may include components such as a sense amplifier, a write driver, and a column selection circuit.

The data I/O circuit 40 may be connected to the read/write circuit 30 through the data lines DL. The data I/O circuit 40 operates in response to the control of the control logic circuit 50. The data I/O circuit 40 is configured to exchange data DATA with an external device. The data I/O circuit 40 is configured to transmit data DATA transmitted from the external device to the read/write circuit 30 through the data lines DL. The data I/O circuit 40 is configured to output data DATA transmitted from the read/write circuit 30 through the data lines DL to the external device. For example, the data I/O circuit 40 may include a component such as a data buffer.

The control logic circuit 50 may be connected to the address decoder 20, the read/write circuit 30, and the data I/O circuit 40. The control logic circuit 50 is configured to control operations of the semiconductor device. The control logic circuit 50 may operate in response to a control signal CTRL transmitted from the external device.

Figure 4:
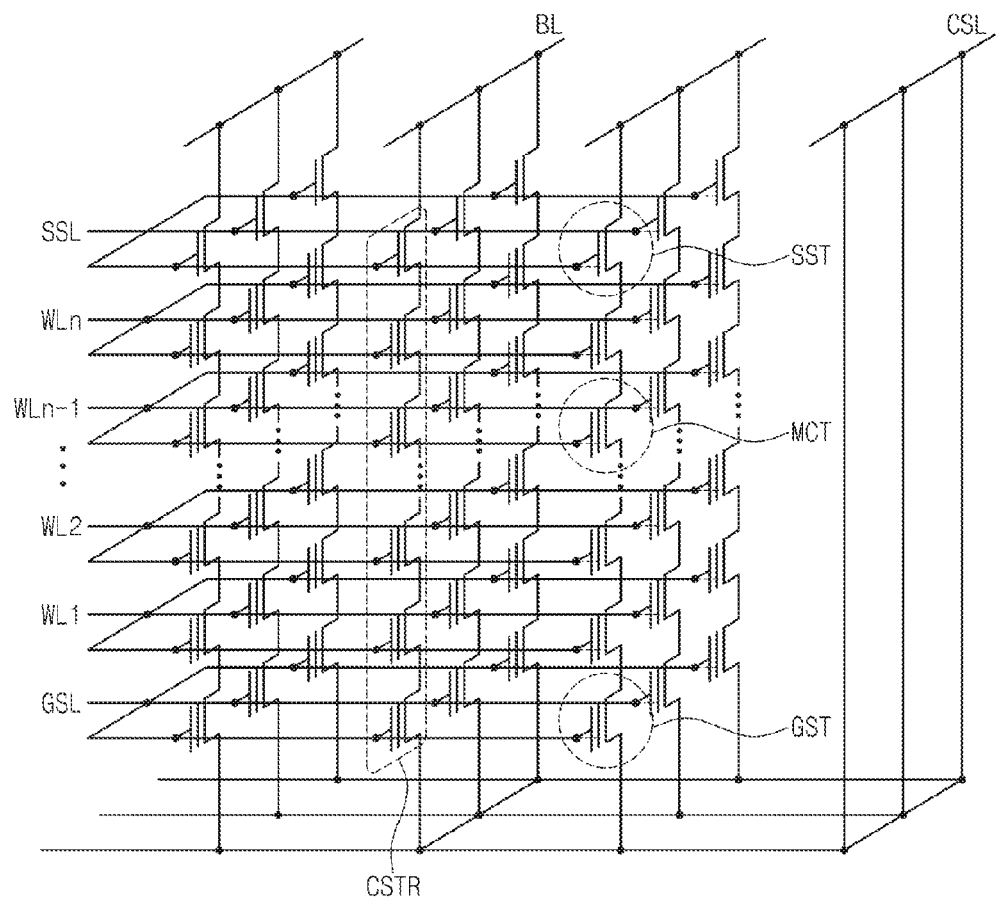
FIG. 4 is a brief circuit diagram of a memory cell array in FIG. 3 according to example embodiments of inventive concepts.

FIG. 4 is a brief circuit diagram of the memory cell array 10 in FIG. 3 according to example embodiments of inventive concepts. As illustrated, the memory cell array 10 may include a common source line CSL, a plurality of bitlines BL, and a plurality of cell strings CSTR coupled between the common source line CSL and the bitlines BL. The cell strings CSTR are connected to each of the bitlines BL.

Each of the cell strings CSTR may include a ground selection transistor GST connected to the common source line CSL, a string selection transistor SST connected to each of the bitlines BL, and a plurality of memory cell transistors MCT disposed between the selection transistors GST and SST. The ground selection transistor GST, the memory cell transistors MCT, and the string selection transistor SST may be connected in series. The ground selection line GSL, the wordlines WL1 to WLn, and the string selection line SSL may correspond to gates of the ground selection transistor GST, the memory cell transistors MCT, and the string selection gate SST, respectively.

Figure 5:
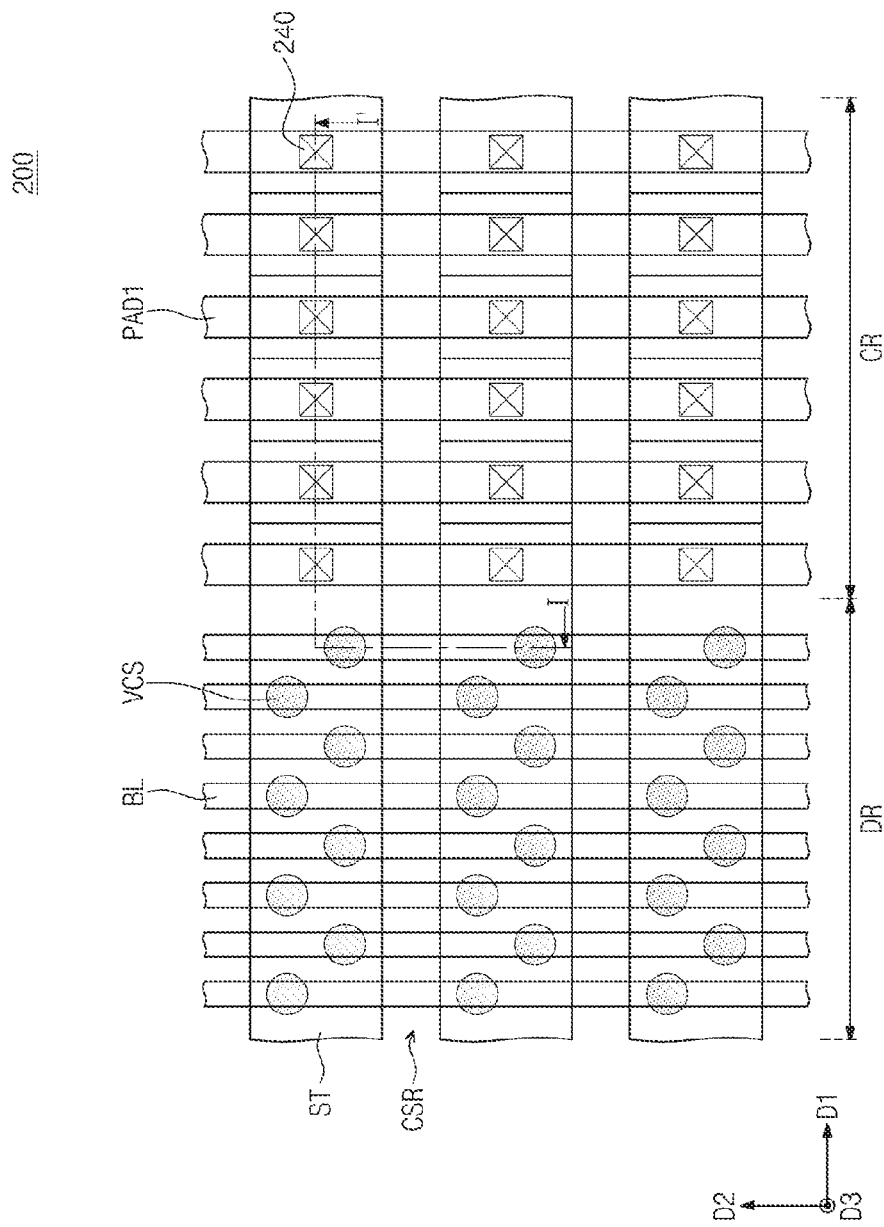
FIG. 5 is a top plan view of a semiconductor device according to example embodiments of inventive concepts.
Figure 6:
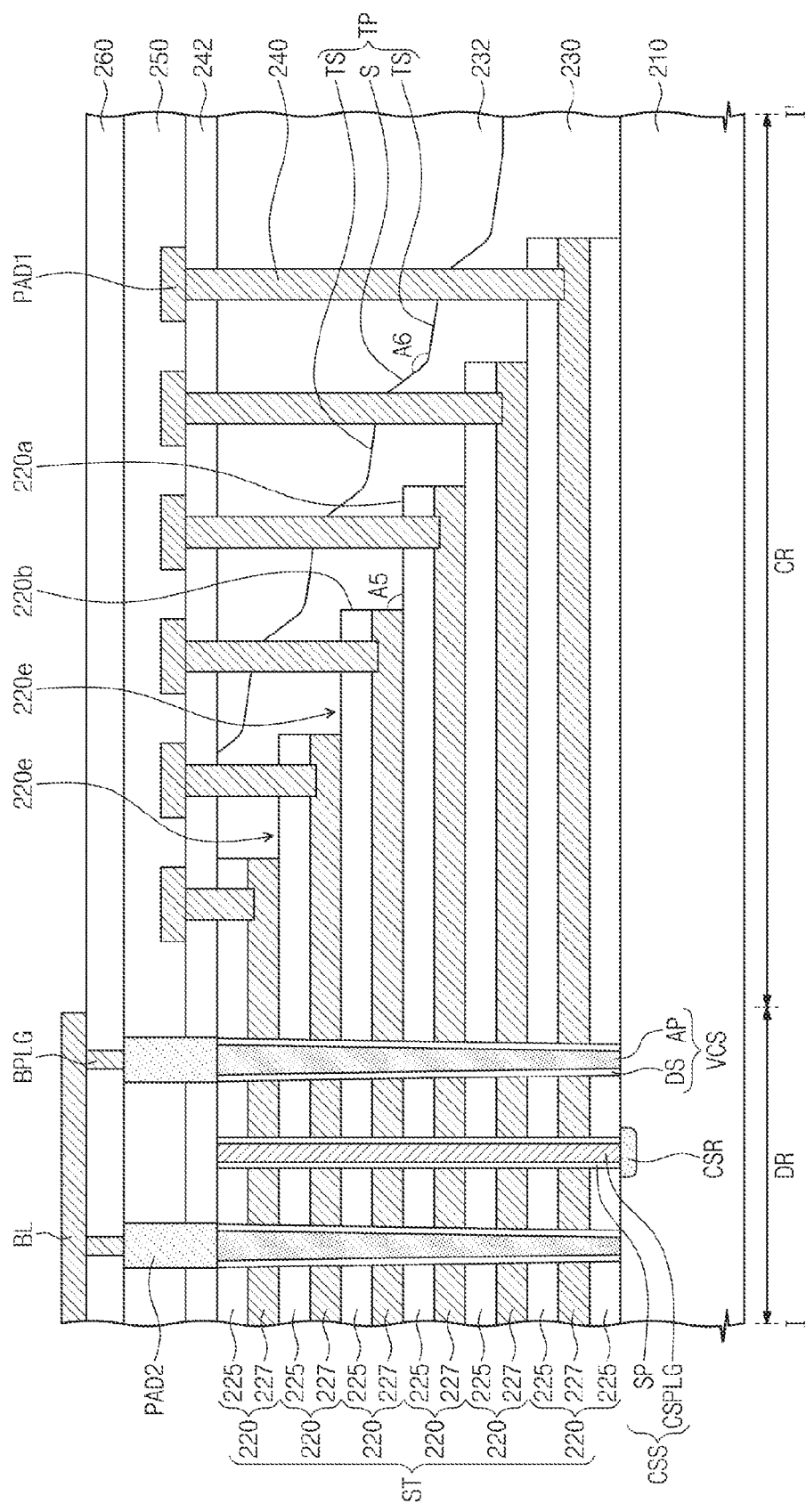
FIG. 6 is a cross-sectional view taken along the line I-I' in FIG. 5.

FIG. 5 is a top plan view of a semiconductor device 200 according to example embodiments of inventive concepts, and FIG. 6 is a cross-sectional view taken along the line I-I' in FIG. 5.

Referring to FIGS. 5 and 6, the semiconductor device 200 may include a substrate 210, a stacked structure ST, a first interlayer dielectric 230, a second interlayer dielectric 232, contacts 240, and vertical channel structures VCS.

The substrate 210 may include a device region DR and a connection region CR. The substrate 210 may be a semiconductor substrate having a first conductivity type, (e.g., P-type) or a semiconductor-on-insulator substrate having the first conductivity type. For example, the semiconductor substrate may include a single-crystalline silicon layer, a silicon layer formed on silicon-germanium (SiGe) layer, a silicon single-crystalline layer formed on an insulating layer or a polysilicon layer formed on an insulating layer.

The stacked structure ST may include a plurality of step layers 220 sequentially stacked on the substrate 210. The stacked step layers 220 may be on the device region DR and may extend onto the connection region CR along a first direction D1. As the step layers 220 become farther away from the substrate 210, each of the step layers 220 may have shorter length in the first direction D1. To put it another way, the stacked structure ST may have a stepwise shape on the connection region CR. Accordingly, each of the step layers 220 may have an end portion 220e exposed by another step layer 220 disposed thereon. In example embodiments, an angle A5 formed by a top surface 220a of an end portion 220e of one step layer 220 and a side surface 220b of another step layer 220 disposed right on the one step layer 220 (e.g., a side surface of the end portion 220e) may be between 85 and 95 degrees. In example embodiments, the angle A5 may be a substantially right angle.

Each of the step layers 220 may include an electrode 227 and an electrode insulating layer 225 that are sequentially stacked. The step layer 220 disposed closest to the substrate 210 may further include an electrode insulating layer 225 between the electrode 227 and the substrate 210. The electrode 227 may include at least one of doped polysilicon, a metal (e.g., tungsten, nickel, cobalt, copper or aluminum), conductive metal nitride (e.g., nickel silicide, titanium silicide or cobalt silicide), and/or a transition metal (e.g., titanium or tantalum). The electrode layer 225 may include at least one of, for example, silicon oxide, silicon nitride, and silicon oxynitride.

On the connection region CR, the first interlayer dielectric 230 may cover end portions 220e of the step layers 220. The first interlayer dielectric 230 may have a plurality of top surfaces TS that are disposed at different levels and do not vertically overlap with each other, and a plurality of sloped surfaces S that connect adjacent top surfaces TS to each other. For example, the first interlayer dielectric 230 may include a plurality of step portions TP. Each of the step portions TP may include one top surface TS, another top surface TS disposed at a higher level than the one top surface TS, and a sloped surface S connecting the top surfaces TS to each other. The top surfaces TS may be disposed on the end portions 220e of the step layers 220 to correspond to the end portions 220e of the step layers 220, respectively. The top surfaces TS may be sloped with respect to a top surface of the substrate 210. The sloped surfaces S may be disposed to horizontally correspond to the side surfaces 220b of the step layers 220, respectively. An angle A6 formed by one top surface TS and a sloped surface S adjacent to the one top surface TS may be greater than the angle A5. For example, the angle A6 may be an obtuse angle. For example, the angle A6 may be between 100 and 150 degrees. In example embodiments, the angle A6 may be between 110 and 150 degrees. The first interlayer dielectric 230 may include, for example, silicon oxide. In example embodiments, the first interlayer dielectric 230 may include silicon nitride or silicon oxynitride.

The second interlayer dielectric 232 may cover the first interlayer dielectric 230. An uppermost surface of the second interlayer dielectric 232 and an uppermost surface of the first interlayer dielectric 230 may be planarized to be coplanar with each other. The second interlayer dielectric 232 may include, for example, silicon oxide. In example embodiments, the second interlayer dielectric 232 may include silicon nitride or silicon oxynitride.

A first capping insulating layer 242 may cover the first and second interlayer dielectrics 230 and 232 and the stacked structure ST. On the connection region CR, each of the contacts 240 may be electrically connected to corresponding one of the electrodes 227 by vertically penetrating the electrode insulating layer 225, the first interlayer dielectric 230, the second interlayer dielectric 232, and the first capping insulating layer 242. The contacts 240 may include at least one of, for example, a metal (e.g., tungsten, copper or aluminum), conductive metal nitride (e.g., titanium nitride or tantalum nitride), and/or a transition metal (e.g., titanium or tantalum). First pads PAD1 may be provided on the contacts 240 to be electrically connected to the contacts 240.

The vertical channel structures VCS may penetrate the stacked structure ST on the device region DR. In example embodiments, the vertical channel structures VCS may be connected to the substrate 210. When viewed from the top, the vertical channel structures VCS may be arranged zigzag in the first direction D1. Alternatively, when viewed from the top, the vertical channel structures VCS may be arranged in a line in the first direction D1. Each of the vertical channel structures VCS may include an active pillar AP and a data storage layer DS disposed on a side surface of the active pillar AP. The data storage layer DS, for example, may include a trap charge layer.

In example embodiments, common source regions CSR may be formed in the substrate 210 between the stacked structures ST. The common source regions CSR may extend in parallel in the first direction D1. The common source regions CSR may be, for example, a common source line. The stacked structures ST and the common source regions CSR may be arranged alternately or repeatedly in a second direction D2 intersecting the first direction D1. The common source regions CSR may be formed by doping impurities of second conductivity type into the substrate 210. That is, the common source regions CSR may have a conductivity type opposite to that of the substrate 210.

In example embodiments, a common source structure CSS may be disposed between adjacent stacked structures ST. The common source structure CSS may include a sidewall insulating spacers SP covering sidewalls of the stacked structures ST and a common source plug CSPLG connected to a common source region CSR between the sidewall insulating spacers SP. The sidewall insulating spacers SP may be formed of silicon oxide, silicon oxynitride or a low-k dielectric. The common source plug CSPLG may include at least one of a metal (e.g., tungsten, copper or aluminum), conductive metal nitride (e.g., titanium nitride or tantalum nitride), and/or a transition material (e.g., titanium or tantalum).

A second capping insulating layer 250 may be provided on the first capping insulating layer 242. The second capping insulating layer 250 may cover the first pads PAD1. The second capping insulating layer 250 may include at least one of, for example, silicon oxide, silicon nitride, and/or silicon oxynitride.

A third capping insulating layer 260 may be provided on the second capping insulating layer 250. The third capping insulating layer 260 may include at least one of, for example, silicon oxide, silicon nitride, and/or silicon oxynitride. Bit-lines BL may be provided on the third capping insulating layer 260 to extend across the stacked structures ST in the second direction D2. The bitlines BL may be electrically connected to the vertical channel structures VCS through second pads PAD2 penetrating the first and second capping insulating layer 242 and 250 and the bitline plugs BPLG penetrating the third capping insulating layer 260.

FIGS. 7A to 7M are cross-sectional views each corresponding to the line I-F in FIG. 5 and illustrate a method for fabricating a semiconductor device according to example embodiments of inventive concepts. For concise description, such a previously described element may be identified by a similar or identical reference number without repeating duplicating descriptions thereof Referring to FIGS. 5 and 7A, a plurality of preliminary step layers 221 may be formed on a substrate 210. Each of the preliminary step layers 221 may include a sacrificial layer 226 and an electrode insulating layer 225 that are sequentially stacked. A preliminary insulating layer 221 stacked closest to the substrate 210 may further include an electrode insulating layer 225 between the sacrificial layer 226 and the substrate 210. The substrate 210 may include a device region DR and a connection region CR. The sacrificial layers 210 may include a material having different etching characteristic than that of the electrode insulating layers 225. The sacrificial layers 226 may include, for example, silicon nitride, silicon oxynitride, polysilicon or polysilicon germanium. The sacrificial layers 226 and the electrode insulating layers 225 may be formed by means of, for example, chemical vapor deposition (CVD).

Figure 7B:
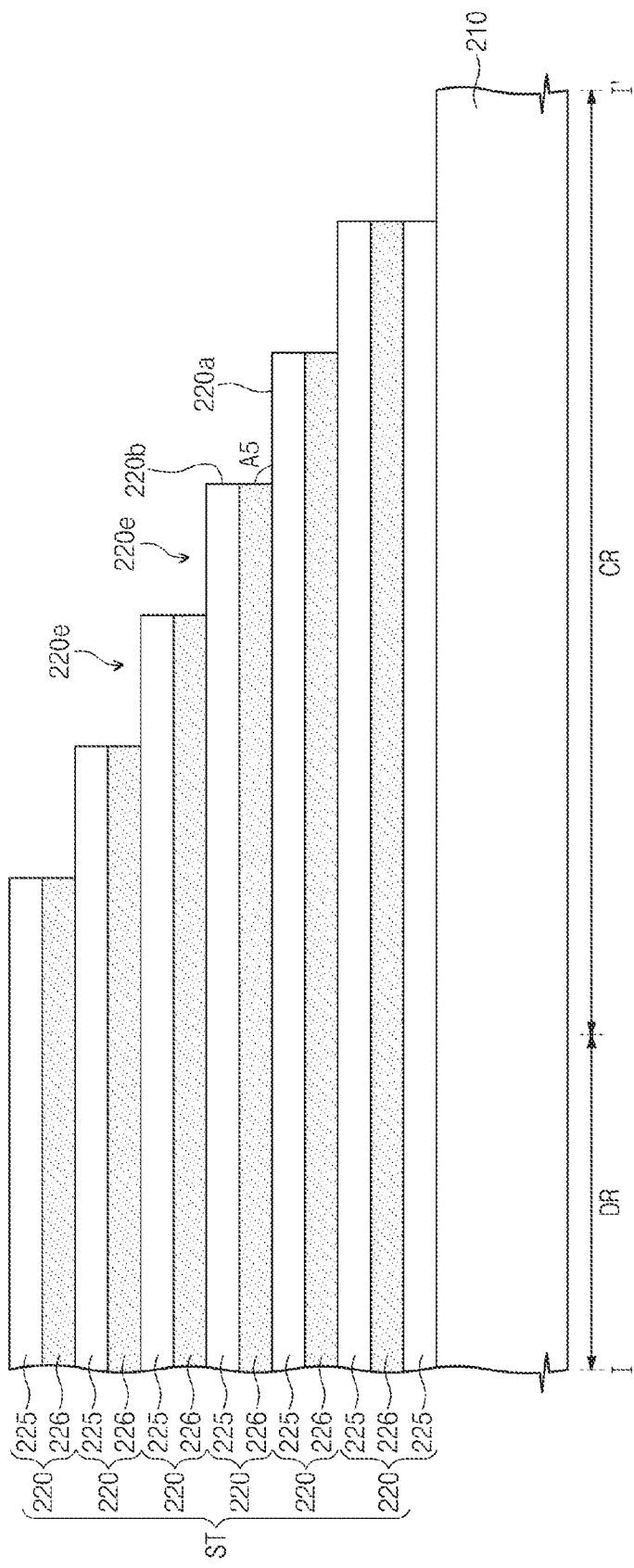

Referring to FIGS. 5 and 7B, a stacked structure having a stepwise shape on the connection region CR may be formed. The stacked structure ST may include step layers 220 that are sequentially stacked. Forming the stacked structure ST may include etching the preliminary layer 221 (see FIG. 7A) on the connection region CR such that each of the step layers 220 has shorter length in the first direction D1 as they become farther away from the substrate 210. On the connection region CR, each of the step layers 220 may have an end portion 220e exposed by another step layer 220 disposed directly thereon. In example embodiments, an angle A5 formed by a top surface 220a of the end portion 220e of the step layer 220 and a side surface 220b of another step layer 220 disposed right on the step layer 220 (e.g., a side surface of the end portion 220e) may be between 85 and 95 degrees. The angle A5 may be a substantially right angle.

Figure 7C:
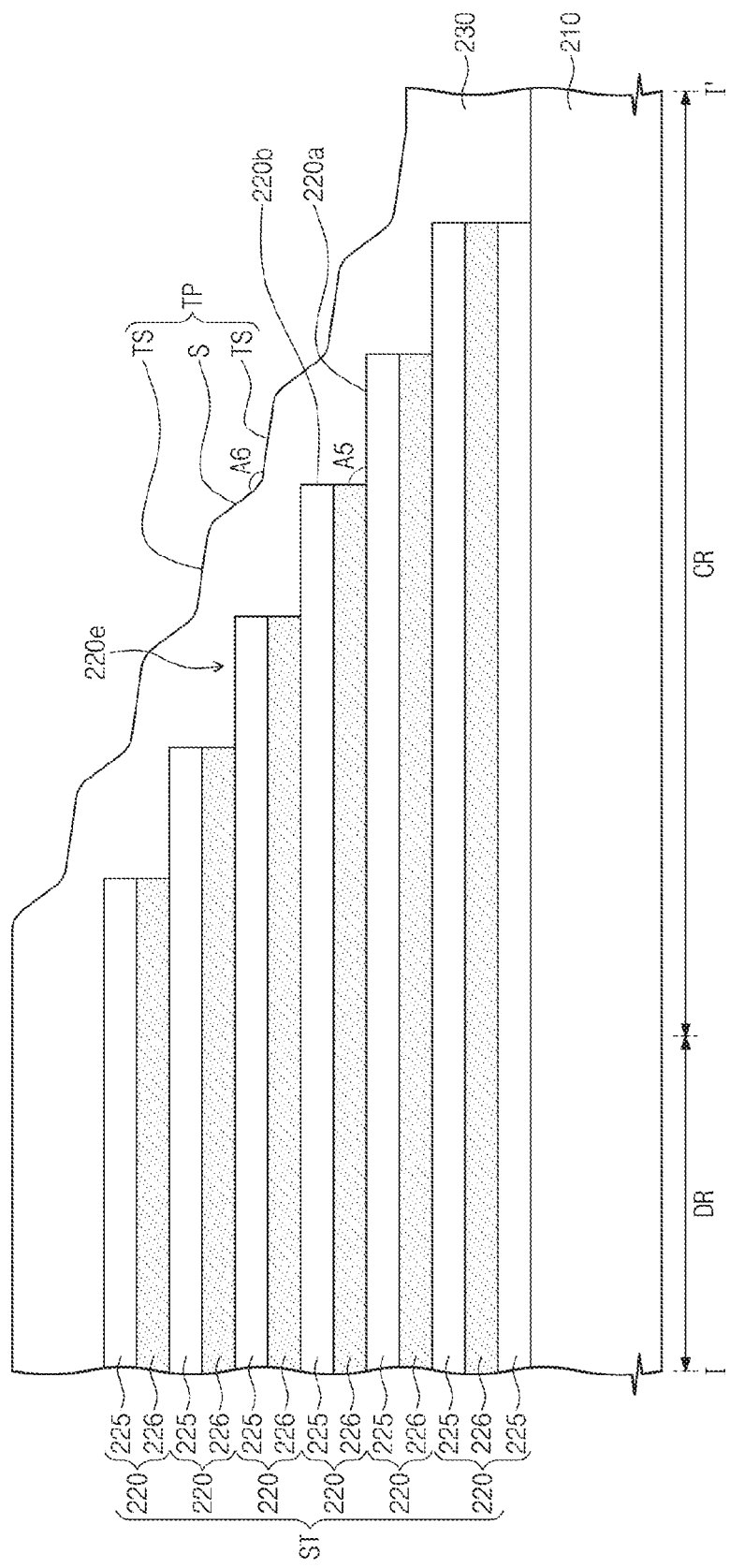

Referring to FIGS. 5 and 7C, a first interlayer dielectric 230 may be formed to cover the stacked structure ST. Forming the first interlayer dielectric may include performing a deposition process with a side step coverage of 50 percent or less. The first interlayer dielectric 230 may include oxide. In example embodiments, forming the first interlayer dielectric 230 may include performing a high-density plasma chemical vapor deposition (HDP CVD) process using a reactive gas containing silane ($SiH_4$) and oxygen ($O_2$).

The first interlayer dielectric 230 may have a plurality of top surfaces TS that are disposed at different levels and do not overlap vertically, and a plurality of sloped surfaces S that connect adjacent top surfaces TS to each other. For example, the first interlayer dielectric 230 may include a plurality of step portions TP. Each of the step portions TP may include one top surface TS, another top surface TS disposed at a higher level than the one top surface TS, and a sloped surface S connecting the top surfaces TS to each other. The top surfaces TS may be disposed on the end portions 220e of the step layers 220 to vertically correspond to the end portions 220e of the step layers 220, respectively. The top surfaces TS may be sloped with respect to a top surface of the substrate 210. The sloped surfaces S may be disposed to horizontally correspond to the side surfaces 220b of the step layers 220, respectively. An angle A6 formed by a top surface TS and a sloped surface S adjacent to the top surface TS may be greater than the angle A5. For example, the angle A6 may be an obtuse angle. In example embodiments, the angle A6 may be between 100 and 150 degrees. For example, the angle A6 may be between 110 and 150 degrees.

Figure 7D:
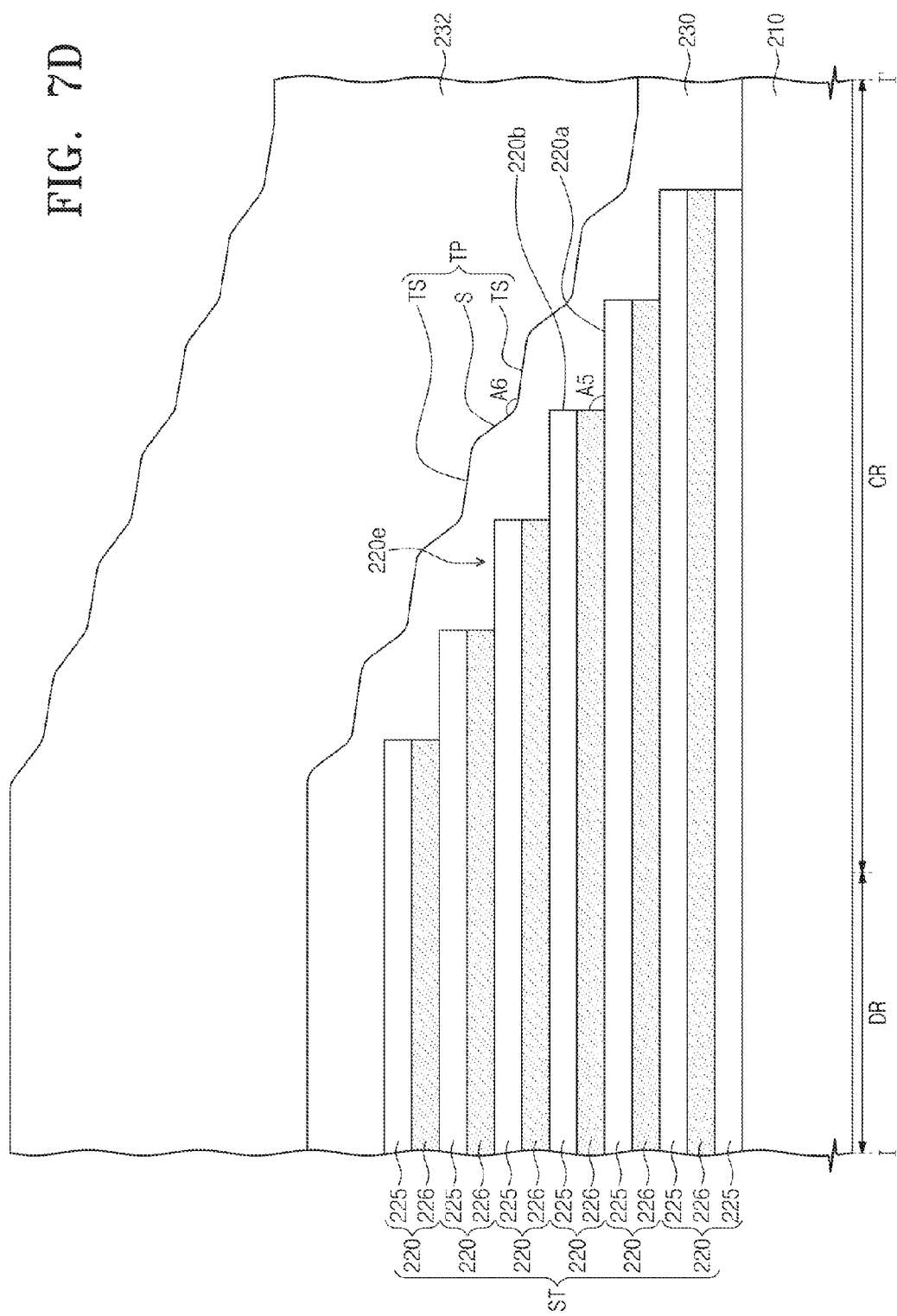

Referring to FIGS. 5 and 7D, a second interlayer dielectric 232 may be formed to cover the first interlayer dielectric 230. Forming the second interlayer dielectric 232 may include performing a deposition process with a higher side step coverage than that of the deposition process for the first interlayer dielectric 230. For example, forming the second interlayer dielectric 232 may include performing a deposition process with a side step coverage of 70 percent or above. The second interlayer dielectric 232 may include oxide. In example embodiments, forming the second interlayer dielectric 232 may include performing a plasma enhanced chemical vapor deposition (PE CVD) process using a reactive gas containing tetraethoxysilane (TEOS), oxygen ($O_2$), and/or nitrous oxide ($N_2O$). The deposition process of the second interlayer dielectric 232 may be performed until a lowermost portion of a top surface of the second interlayer dielectric 232 has a higher level than an uppermost of a top surface of the stacked structure ST.

Figure 7E:
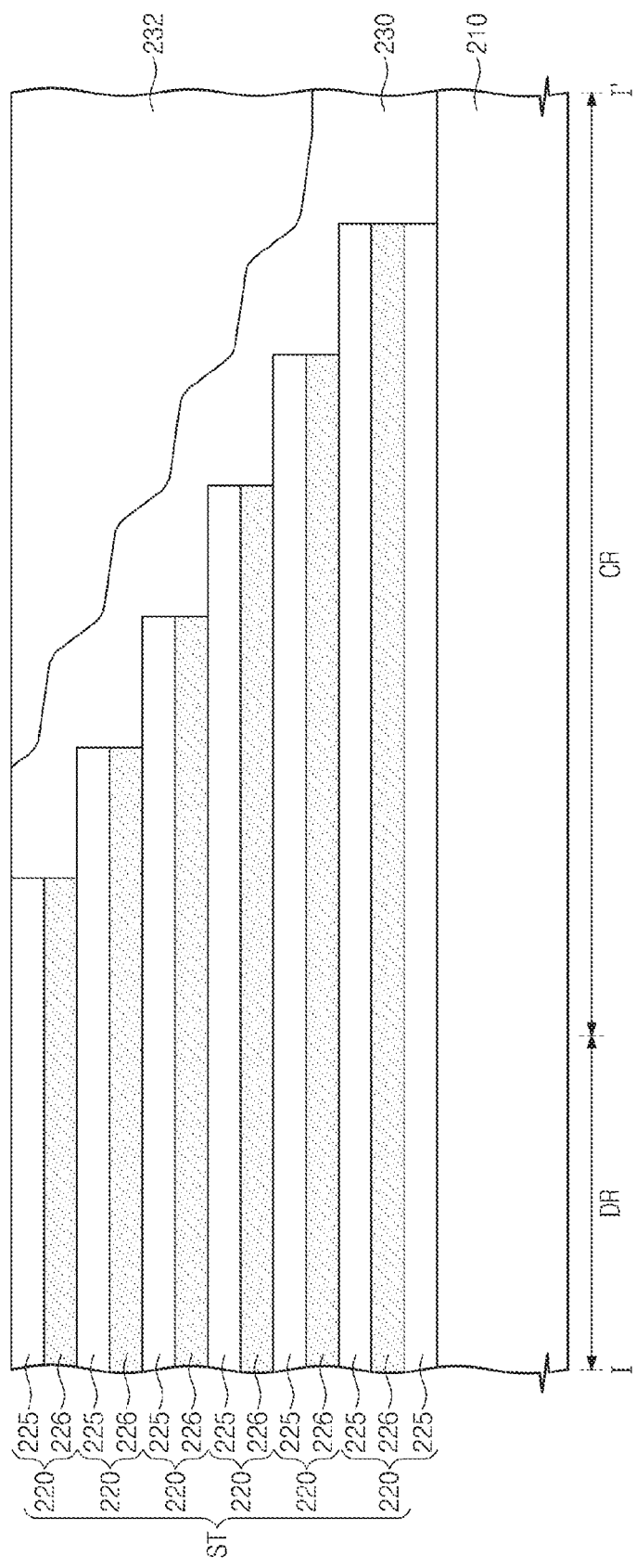

Referring to FIGS. 5 and 7E, a planarization process may be performed. The planarization process may include removing upper portions of the first interlayer dielectric 230 and the second interlayer dielectric 232 using a chemical mechanical polishing (CMP) process.

Figure 7F:
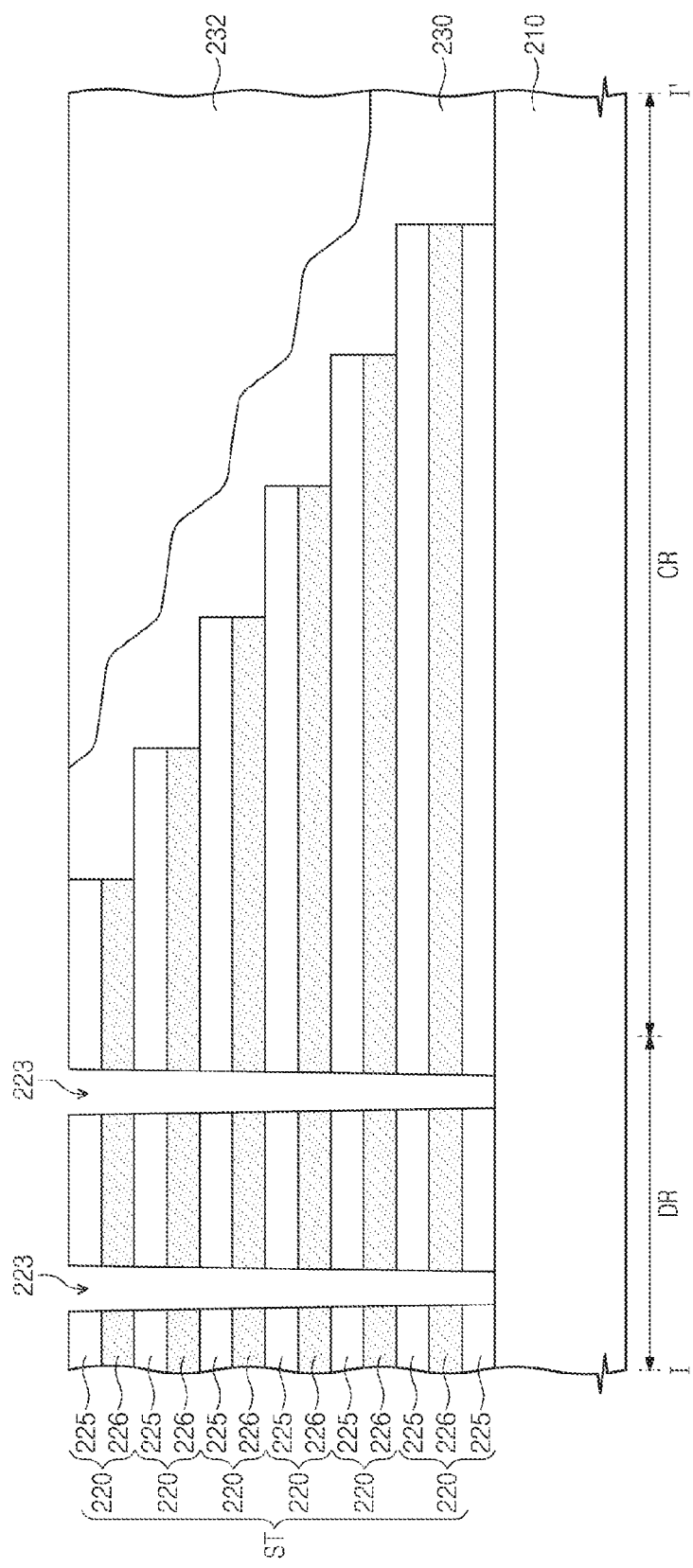

Referring to FIGS. 5 and 7F, vertical holes 223 may be formed through the vertical structure ST to expose the substrate 210 on the device region DR. Forming the vertical holes 223 may include anisotropically etching the vertical structure ST.

Figure 7G:
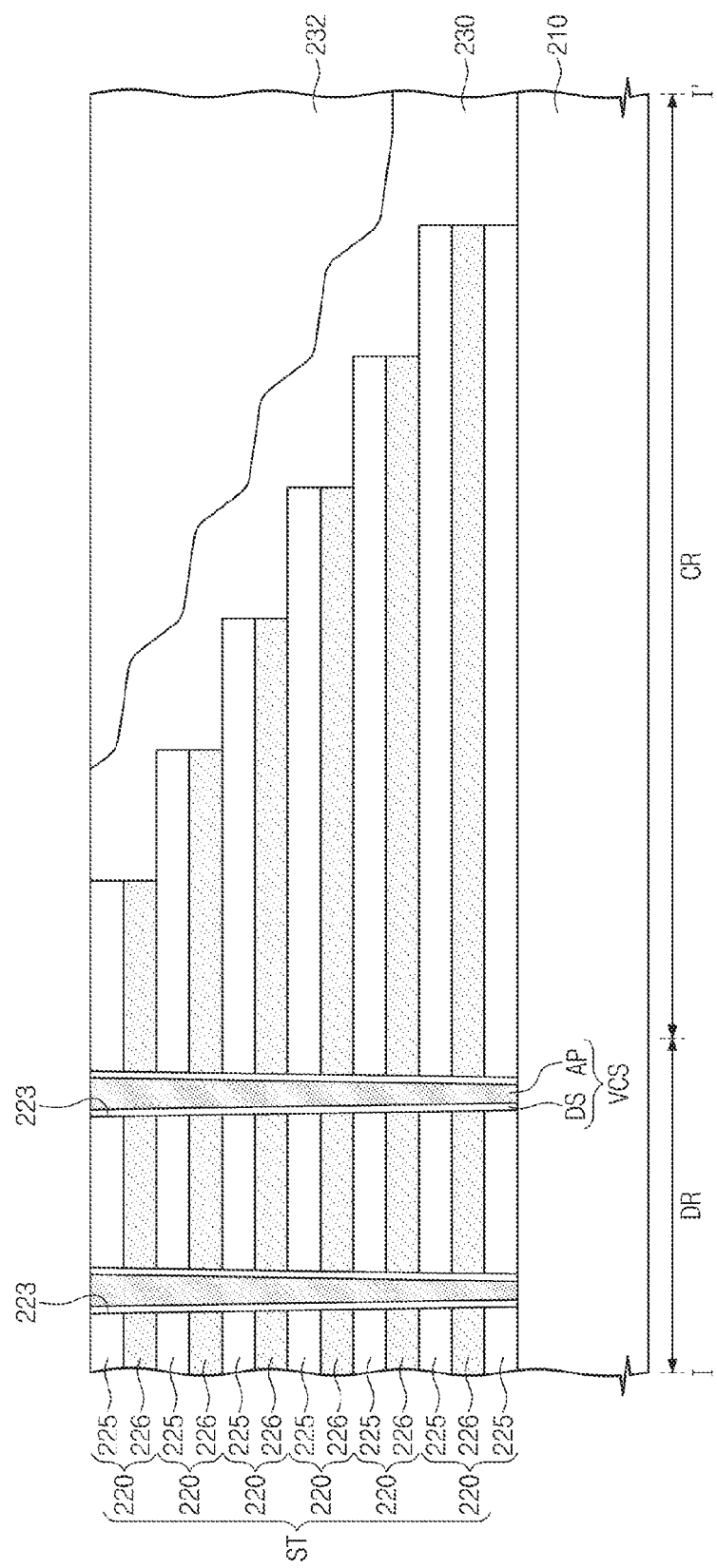

Referring to FIGS. 5 and 7G, vertical channel structures VCS may be formed to fill the vertical holes 223. Each of the vertical channel structures VCS may include an active pillar AP and a data storage layer DS disposed on a sidewall of the active pillar AP. The data storage layer DS may be formed on inner wall of each of the vertical holes 223 and may be formed by means of, for example, an atomic layer deposition (ALD) process. The active pillar AP may be formed on the data storage layer DS within the vertical holes 223 and may be formed by means of, for example, a chemical vapor deposition (CVD) process or an atomic layer deposition (ALD) process. The data storage layer DS, for example, may include a trap charge layer.

Figure 7H:
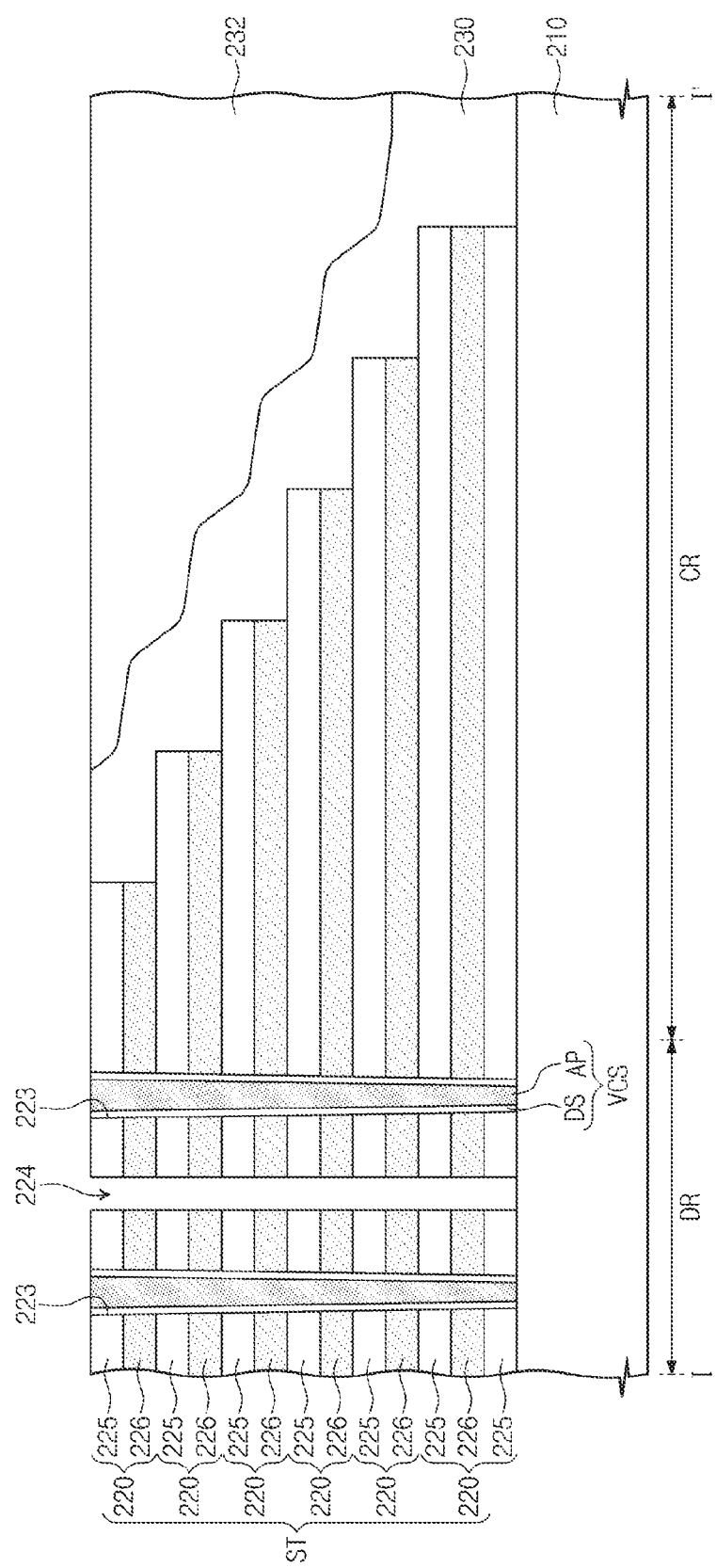

Referring to FIGS. 5 and 7H, by patterning the stacked structure ST, isolation trenches 224 may be formed to extend in the first direction D1. The substrate 210 may be exposed by the isolation trenches 224. By patterning the stacked structure ST to include vertical channel structures VCS arranged zigzag in the first direction D1 as shown in FIG. 5, isolation trenches 224 may be formed.

Referring to FIGS. 5 and 7I, the sacrificial layers 226 (see FIG. 7H) may be removed to form electrode regions 229. The electrode regions 229 correspond to a region in which the sacrificial layers 226 (see FIG. 7H) are removed and are defined by the vertical channel structures VCS, the electrode insulating layers 225, and the first interlayer dielectric 230. If the sacrificial layers 226 (see FIG. 7H) include silicon nitride or silicon oxynitride, a process of removing the sacrificial layers 226 (see FIG. 7H) may be performed using an etchant containing phosphoric acid.

Figure 7J:
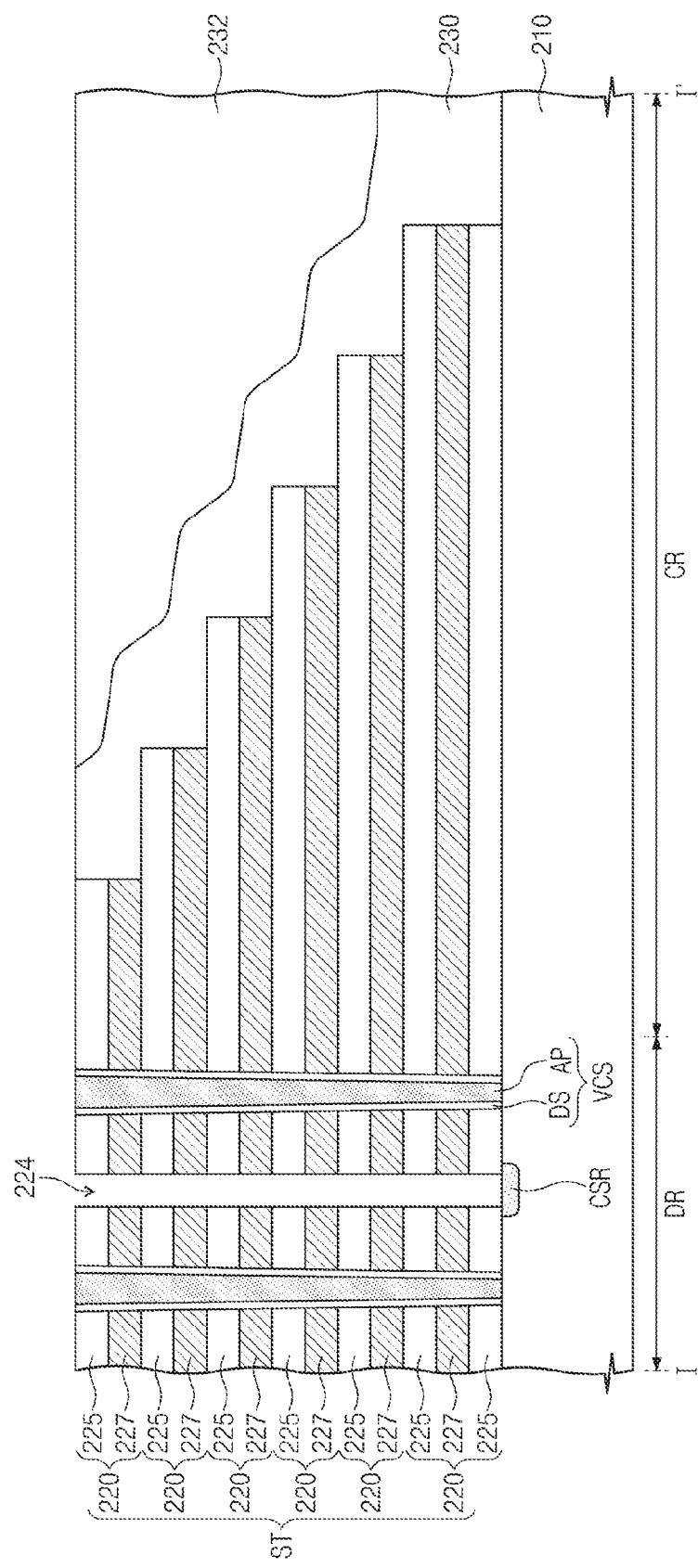

Referring to FIGS. 5 and 7J, a conductive layer (not shown) may be formed in the electrode regions 229 (see FIG. 7I) through the isolation trenches 224. The conductive layer may include at least one of doped polysilicon, a metal (e.g., tungsten, nickel, cobalt, copper or aluminum), conductive metal nitride (e.g., nickel silicide, titanium silicide or cobalt silicide), and/or a transition metal (e.g., titanium or tantalum). The conductive layer may be formed by means of atomic layer deposition (ALD).

The conductive layer formed outside of the electrode regions 229 (see FIG. 7I), i.e., formed at the isolation trenches 224 is removed. Accordingly, the electrodes 227 in the electrode regions 229 (see FIG. 7I) may be formed. As a result, the sacrificial layers 226 (see FIG. 7H) of the stacked structure ST may be replaced with the electrodes 227. The conductive layer formed at the isolation trenches 224 may be removed to expose the substrate 210. Impurities of a second conductivity type may be heavily doped into the exposed substrate 210 to form common source regions CSR.

Figure 7K:
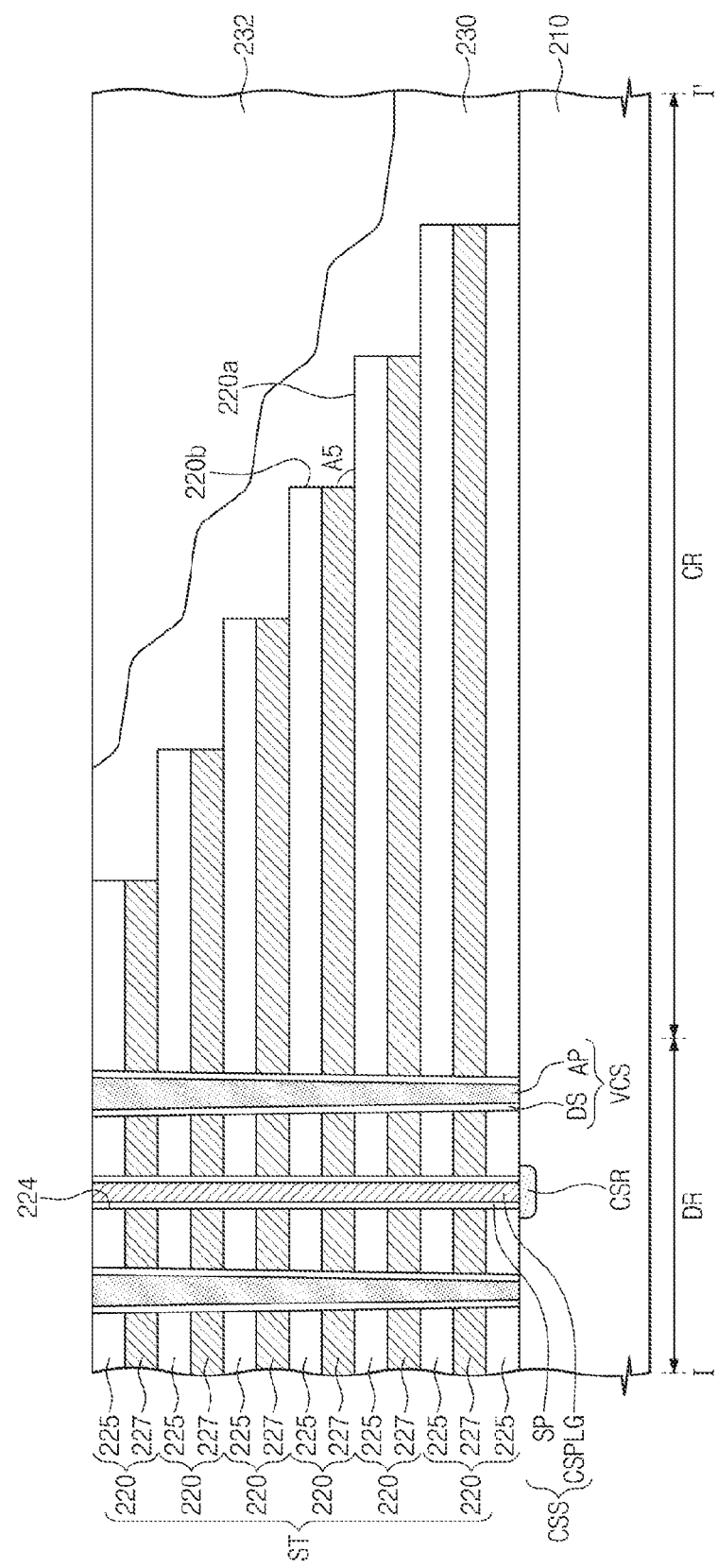

Referring to FIGS. 5 and 7K, common source structures CSS may be formed to fill the isolation trenches 224. Each of the common source structures CSS may include a sidewall insulating spacers SP and a common source plug CSPLG. The sidewall insulating spacers SP may be formed by depositing a silicon oxide layer or a silicon nitride layer and anisotropically etching the silicon oxide layer or the silicon nitride layer. The common source plug CSPLG may be formed to fill a gap between the sidewall insulating spacers SP and may be formed by means of, for example, chemical vapor deposition (CVD). The common source plug CSPLG may include at least one selected from the group consisting of a metal (e.g., tungsten, copper or aluminum), conductive metal nitride (e.g., titanium nitride or tantalum nitride), and a transition metal (e.g., titanium or tantalum) and may be electrically connected to the common source region CSR.

Referring to FIGS. 5 and 7L, a first capping insulating layer 242 may be formed on the stacked structure ST, the first interlayer dielectric 230, and the second interlayer dielectric 232. The first capping insulating layer 242 may include at least one of silicon oxide, silicon nitride, and silicon oxynitride. Contact holes CH may be formed through the electrode insulating layers 225, the first interlayer dielectric 230, the second interlayer dielectric 232, and the first capping insulating layer 242 to expose a top surface of the end portion of each of the electrodes 227. Forming the contact holes CH may include performing dry etching with a higher etch rate with respect to the electrode insulating layers 225, the first interlayer dielectric 230, the second interlayer dielectric 232, and the first capping insulating layer 242 than with respect to the electrodes 227.

Figure 7M:
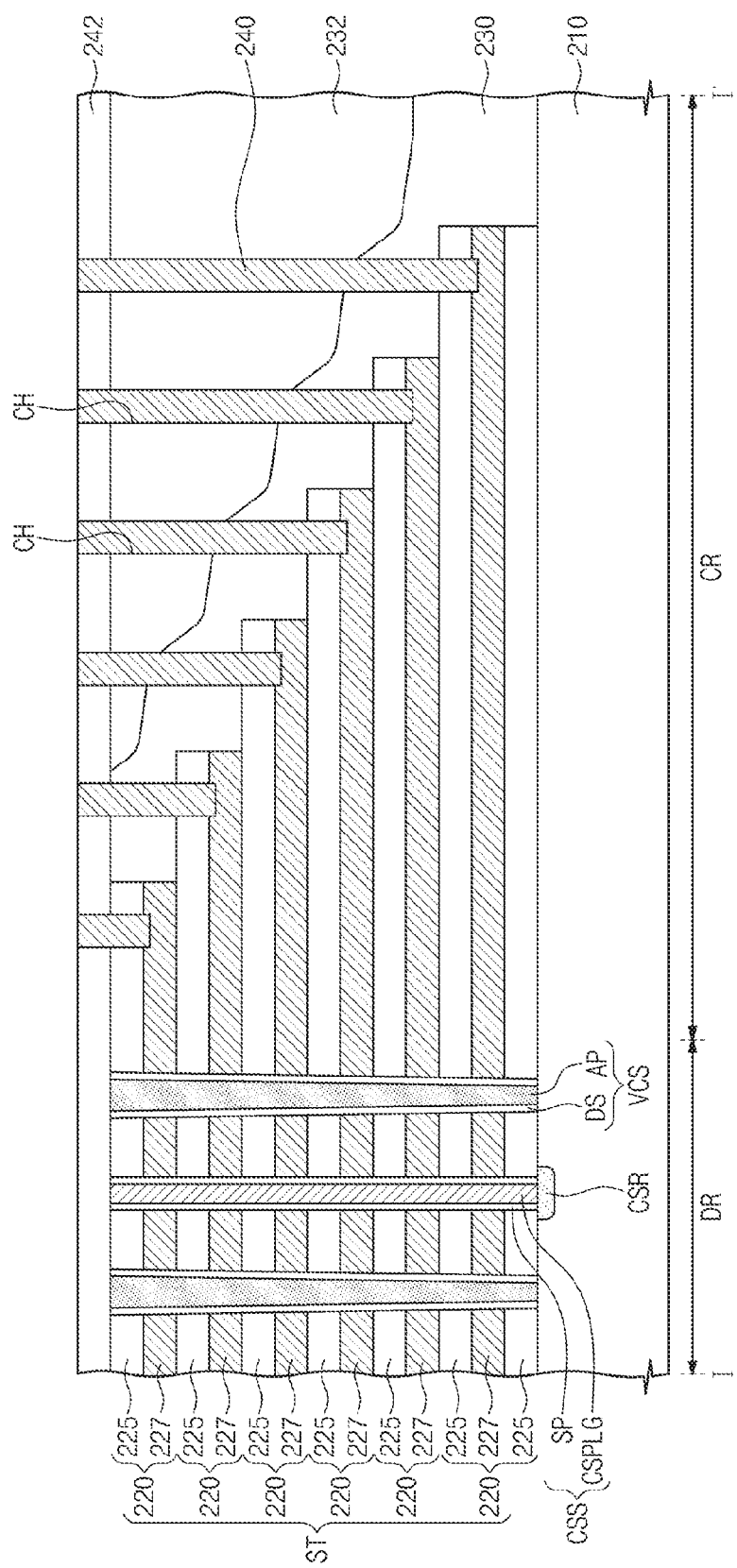

Referring to FIGS. 5 and 7M, contacts 240 may be formed to fill the contact holes CH. The contacts 240 may be electrically connected to the corresponding one of the electrodes 227. The contacts 240 may include at least one of, for example, a metal (e.g., tungsten, copper or aluminum), conductive metal nitride (e.g., titanium nitride or tantalum nitride), and/or a transition metal (e.g., titanium or tantalum).

Returning to FIGS. 5 and 6, first pads PAD1 may be formed on the first capping insulating layer 232 to be electrically connected to the contacts 240.

A second capping insulating layer 250 may be formed to cover the first pads PAD1. The second capping insulating layer 250 may include at least one of silicon oxide, silicon nitride, and silicon oxynitride. Second pads PAD2 may be formed to be electrically connected to the active pillar AP by penetrating the first and second capping insulating layers 242 and 250.

A third capping insulating layer 260 may be formed to cover the second capping insulating layer 250. Bitline plugs BPLG may be formed to be electrically connected to the second pads PAD2 by penetrating the third capping insulating layer 260. Bitlines BL may be formed on the bitline plugs BPLG in a second direction D2 intersecting the first direction D1. The bitlines BL may electrically connect the bitline plugs BPLG to each other in the second direction D2. The bitlines BL and the bitline plugs BPLG may include at least one of, for example, a metal (e.g., tungsten, copper or aluminum), conductive metal nitride (e.g., titanium nitride or tantalum nitride), and/or a transition metal (e.g., titanium or tantalum).

According to the above-described method for fabricating a semiconductor device, a first interlayer dielectric is formed on a stacked structure having a stepwise shape using a deposition process with a low side step coverage and a second interlayer dielectric is formed on the first interlayer dielectric using a deposition process with a higher side step coverage. The first interlayer dielectric may have a stepwise shape including step portions where an angle formed by a top surface and a side surface is an obtuse angle, because the first interlayer dielectric is formed using the deposition process with a low side step coverage. Since the second interlayer dielectric is formed on the first interlayer dielectric having the stepwise shape with the obtuse angle, cusping may be limited (and/or prevented). Thus, with the method for fabricating a semiconductor device according to example embodiments of inventive concepts, reliability and yield may be enhanced.

Figure 8:
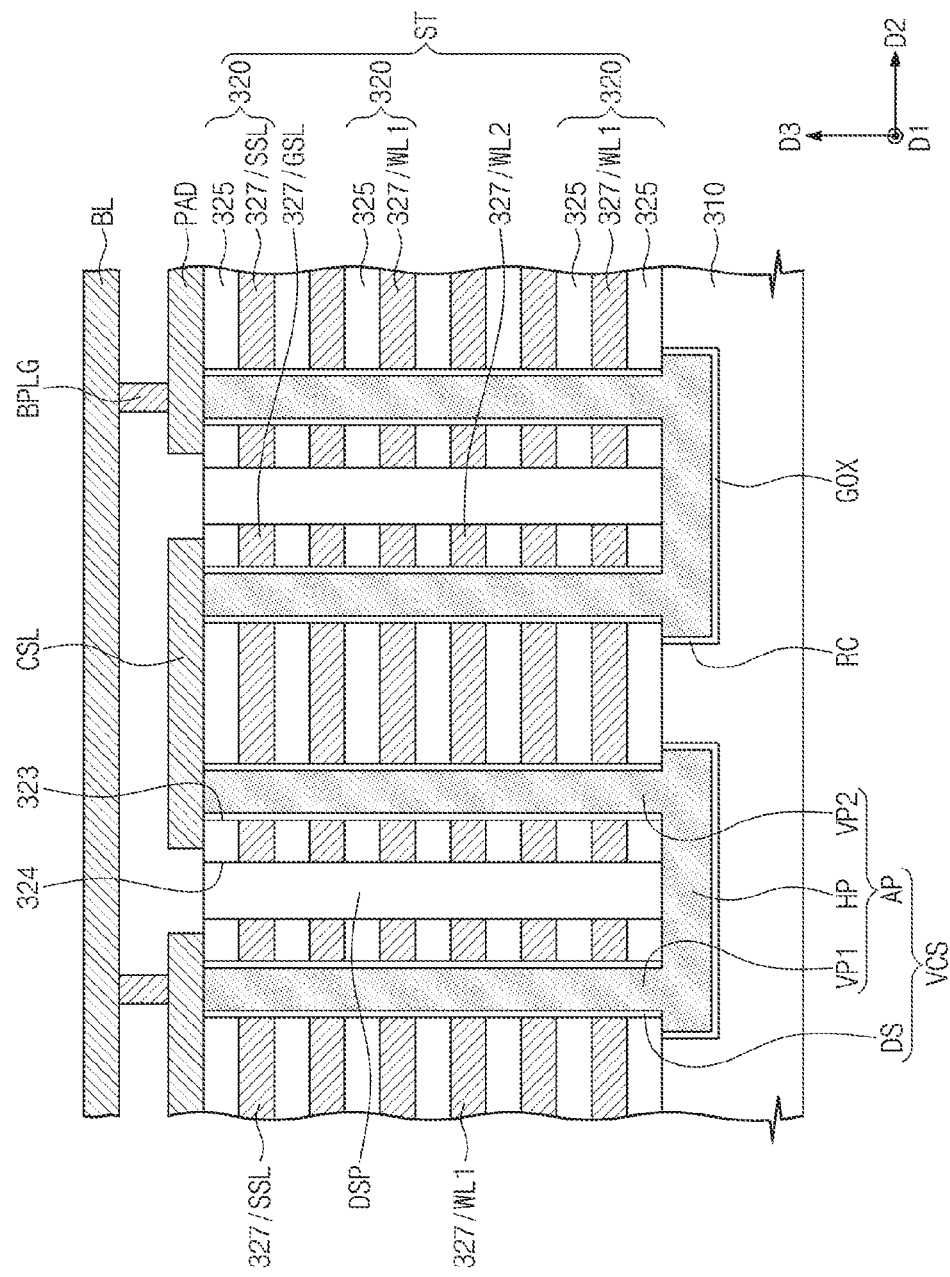
FIG. 8 is a cross-sectional view of a semiconductor device according to example embodiments of inventive concepts.

FIG. 8 is a cross-sectional view of a semiconductor device 300 according to example embodiments of inventive concepts and shows a portion corresponding to the device region of the semiconductor device described with reference to FIGS. 5 and 6. As illustrated, the semiconductor device 300 may include a substrate 310, bitlines BL on the substrate 310, stacked structures between the substrate 310 and the bitlines BL, a common source line CSL between the stacked structures ST and the bitlines BL, and vertical channel structures VCS penetrating the stacked structures ST. The stacked structures ST may include a plurality of step layers 320 that are sequentially stacked. Each of the step layers 320 may include an electrode 327 and an electrode insulating layer 325 that are sequentially stacked. The step layer 320 disposed closest to the substrate 310 may further include a single electrode insulating layer 325 between the electrode 327 and the substrate 310. The stacked structures ST may extend in a first direction D1. The stacked structures ST may be spaced apart from each other in a second direction D2 intersecting (e.g., perpendicular to) the first direction D1 by isolation trenches 324 extending in the first direction D1. The electrodes 327 may include doped silicon, a metal (e.g., tungsten), metal nitride, metal silicide or a combination thereof. The electrode insulating layers 325 may be a silicon oxide layer.

The electrodes 327 may be stacked on the substrate 310 vertically (in a third direction D3). The electrodes 327 may include a string selection line SSL, wordlines WL, and a ground selection line GSL. The string selection line SSL may be disposed between the wordlines WL and the bitlines BL. The ground selection line GSL may be disposed between the wordlines WL and the common source line CSL. The wordlines WL may be stacked on the substrate in a direction perpendicular to the substrate 310. The string selection line SSL and the ground selection line GSL may be disposed on the wordlines WL. The string selection line SSL and the ground selection line GSL may be spaced apart from each other in the second direction D2 by the isolation trenches 324. The wordlines WL may include upper wordlines WL1 disposed between the substrate 310 and the string selection line SSL, and lower wordlines WL2 disposed between the substrate 310 and the ground selection line GSL. The upper wordlines WL1 and the lower wordlines WL2 may be spaced apart from each other in the second direction D2 by the isolation trench 324.

A device isolation pattern DSP may be provided between the string selection line SSL and the ground selection line GSL, and between the upper wordlines WL1 and the lower wordlines WL2. The device isolation pattern DSP may be in the form of a line extending in the first direction D1. The device isolation pattern DSP may include at least one of silicon oxide, silicon nitride, and silicon oxynitride to fill the isolation trench 324.

A plurality of active pillars AP may penetrate the stacked structure ST. The active pillars AP may be arranged in the first direction, when viewed from the top.

The active pillar AP may connect the bitlines BL and the common source line CSL to each other. Bitline plugs and a pad PAD may be further disposed between the stacked structures ST and the bitlines BL to establish electrical connection therebetween.

Each of the active pillars may include vertical portions VP penetrating the stacked structures ST and a horizontal portion HP connecting the vertical portions VP to each other below the stacked structures ST. The vertical portions VP may be provided in vertical holes 323 penetrating the stacked structure ST. The horizontal portion HP may be provided in a horizontal recessed portion RC on the substrate 310. One of a pair of the vertical portions VP may be connected to the common source line CSL, and the other one of the pair of vertical portions VP may be connected to a corresponding one of the bitlines BL. The horizontal portion HP may be provided between the substrate 310 and the stacked structures ST to connect the pair of vertical portions VP to each other.

For example, in each of the active pillars AP, the vertical portions VP may include a first vertical portion VP1 penetrating the upper wordlines WL1 and the string selection line SSL and a second vertical portion VP2 penetrating the lower wordlines WL2 and the ground selection line GSL. The first vertical portion VP1 may be connected to a corresponding one of the bitlines BL, and the second vertical portion VP2 may be connected to the common source line CSL. The horizontal portion HP may extend from an underlying portion of the upper wordlines WL1 to an underlying portion of the lower wordlines WL2 to connect the first and second vertical portions VP1 and VP2 to each other.

A data storage layer DS may be provided between the active pillars AP and the electrodes 327. A gate insulating layer GOX may be provided between the active pillars AP and the substrate 310. The gate insulating layer GOX may be a silicon oxide layer.

The stacked structure ST extending in the first direction D1 may be formed to have substantially the same structure as a structure formed on the connection region CR (see FIGS. 5 and 6) described with reference to FIGS. 5 and 6. As the step layers 320 become farther away from the substrate 310, each of the step layers 320 may have shorter length in the first direction D1. To put it another way, the stacked structure ST may have a stepwise shape on the connection region. Accordingly, each of the step layers 320 may have an end portion (not shown) exposed by another step layer 320 disposed thereon. In example embodiments, an angle (not shown) formed by a top surface of an end portion of one step layer 320 and a side surface of another step layer 320 disposed right on the one step layer 320 may be between 85 and 95 degrees. In example embodiments, the angle formed by a top surface of an end portion of one step layer 320 and a side surface of another step layer 320 disposed right on the one step layer 320 may be a substantially right angle.

A first interlayer dielectric (not shown) may be substantially identical to the first interlayer dielectric 230 (see FIGS. 5 and 6) described with reference to FIGS. 5 and 6. The first interlayer dielectric may cover end portions (not shown) of the step layers 320 in a connection region (not shown). The first interlayer dielectric may include a plurality of top surfaces (not shown) that are disposed at different levels and do not overlap vertically, and a plurality of sloped surfaces (not shown) that connect adjacent top surfaces to each other. The top surfaces may be disposed on the end portions of the step layers 320 to vertically correspond to the end portions of the step layers 320, respectively. The top surfaces may be sloped with respect to a top surface of the substrate 310. The sloped surfaces may be disposed to horizontally correspond to the side surfaces of the step layers 320, respectively. An angle (not shown) formed by one top surface and a sloped surface adjacent to the one top surface may be greater than the angle formed by a top surface of an end portion of one step layer 320 and a side surface of another step layer 320 disposed right on the one step layer 320. For example, the angle formed by one top surface and a sloped surface adjacent to the top one surface may be an obtuse angle. In example embodiments, the angle formed by one top surface and a sloped surface adjacent to the one top surface may be between 100 and 150 degrees. In example embodiments, the angle formed by one top surface and a sloped surface adjacent to the one top surface may be between 110 and 150 degrees.

A second interlayer dielectric (not shown) may be substantially identical to the second interlayer dielectric 232 (see FIGS. 5 and 6) described with reference to FIGS. 5 and 6.

Contacts (not shown) may be substantially identical to the contacts 240 (see FIGS. 5 and 6) described with reference to FIGS. 5 and 6. Each of the contacts may be electrically connected to corresponding one of the electrodes 327 by vertically penetrating the electrode insulating layer 325, the first interlayer dielectric (not shown), and the second interlayer dielectric (not shown).

Figure 9:
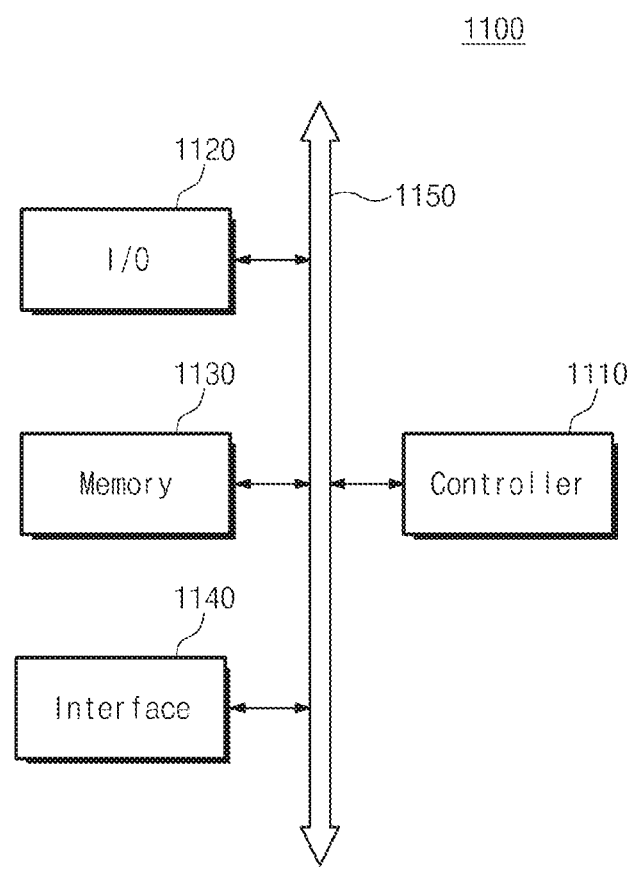
FIG. 9 is a brief block diagram illustrating an example of an electronic system including a memory device formed according to example embodiments of inventive concepts.

FIG. 9 is a brief block diagram illustrating an example of an electronic system 1100 including a memory device formed according to example embodiments of inventive concepts. As illustrated, the electronic system 1100 may include a controller 1110, an input/output (I/O) device 1120, a memory device 1130, an interface 1140, and a bus 1150. The controller 1110, the I/O device 1120, the memory device 1130, and/or the interface 1140 may be connected to each other through the bus 1150. The bus 1150 corresponds to a data transmission path. The memory device 1130 may include a semiconductor device according to example embodiments of inventive concepts.

The controller 1110 may include at least one of a microprocessor, a digital signal processor, a microcontroller or logic elements capable of performing similar functions to those of the above elements. The I/O device 1120 may include a keypad, a keyboard, and a display device. The memory device 1130 may store data and/or commands. The interface 1140 may transmit data to a communication network or receive data from the communication network. The interface 1140 may be in a wired or wireless form. For example, the interface 1140 may include an antenna or a wired/wireless transceiver. Although not shown in this drawing, the electronic system 1100 may further include a high-speed dynamic random access memory (DRAM) device and/or a high-speed static random access memory (SRAM) device as a working memory device to improve the operation of the controller 1110.

The electronic system 1100 can be applied to a personal digital assistant (PDA), a portable computer, a web tablet, a wireless phone, a mobile phone, a digital music player, a memory card, and all electronic products that can transmit and/or receive information wirelessly.

Figure 10:
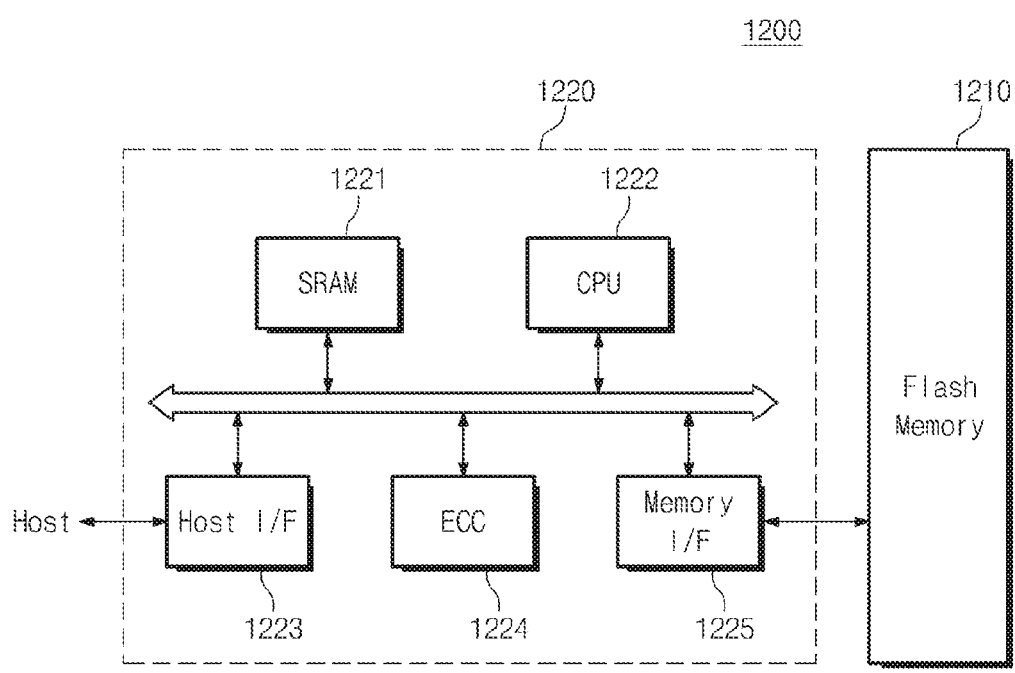
FIG. 10 is a brief block diagram illustrating an example of a memory system including a memory device formed according to example embodiments of inventive concepts.

FIG. 10 is a brief block diagram illustrating an example of a memory system 1200 including a memory device formed according to example embodiments of inventive concepts. As illustrated, the memory system 1200 may include a memory device 1210. The memory device 1210 may include a semiconductor device according to example embodiments, as described above. The memory device 1210 may further include another type of a semiconductor memory device (e.g., a DRAM device and/or an SRAM device, etc.). The memory system 1200 may include a memory controller 1220 to control data exchange between a host and the memory device 1210.

The memory controller 1220 may include a processing unit 1222 to control the overall operation of the memory system 1200. The memory controller 1220 may include an SRAM 1221 used as a working memory of the processing unit 1222. The memory controller 1220 may further include a host interface 1223 and a memory interface 1225. The host interface 1223 may have a data exchange protocol between the memory card 1200 and the host. The memory interface 1225 may connect the memory controller 1220 and the memory device 1210 to each other. The memory controller 1220 may further include an error correction block (ECC) 1224. The error correction block 1224 may detect and correct an error of data read from the memory device 1210. Although not shown, the memory system 1200 may further include a ROM device to store code data for interfacing with the host. The memory system 1200 may be used as a handheld data storage card. For example, the memory system may be a memory card or a solid state drive (SSD).

FIGS. 11A to 11D illustrate a method for fabricating a semiconductor device according to example embodiments of inventive concepts. The method in FIGS. 11A to 11D may be the same as the method in FIGS. 7A to 7M, except for the following differences.

Referring to FIG. 11A, FIG. 11A may be the same as FIG. 7B as described above.

Figure 11B:
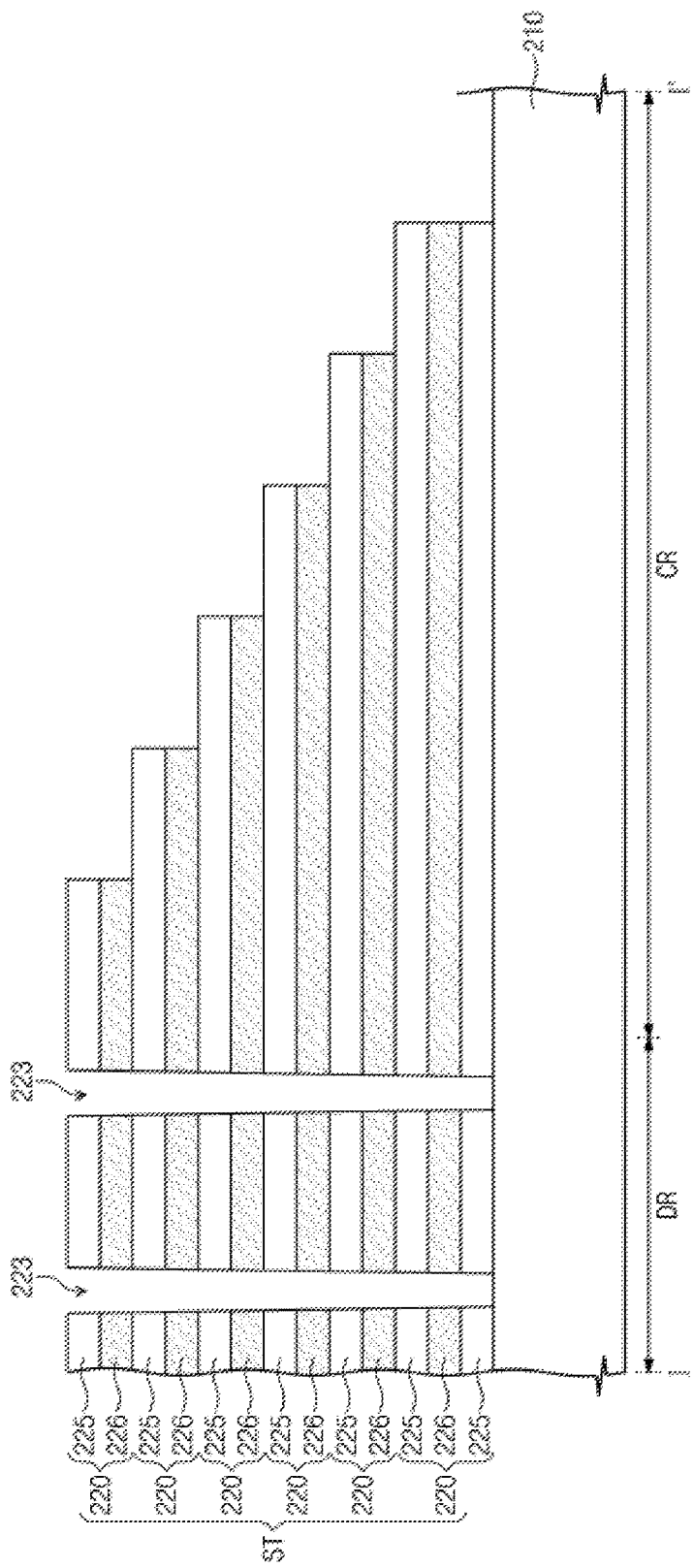
Figure 11C:
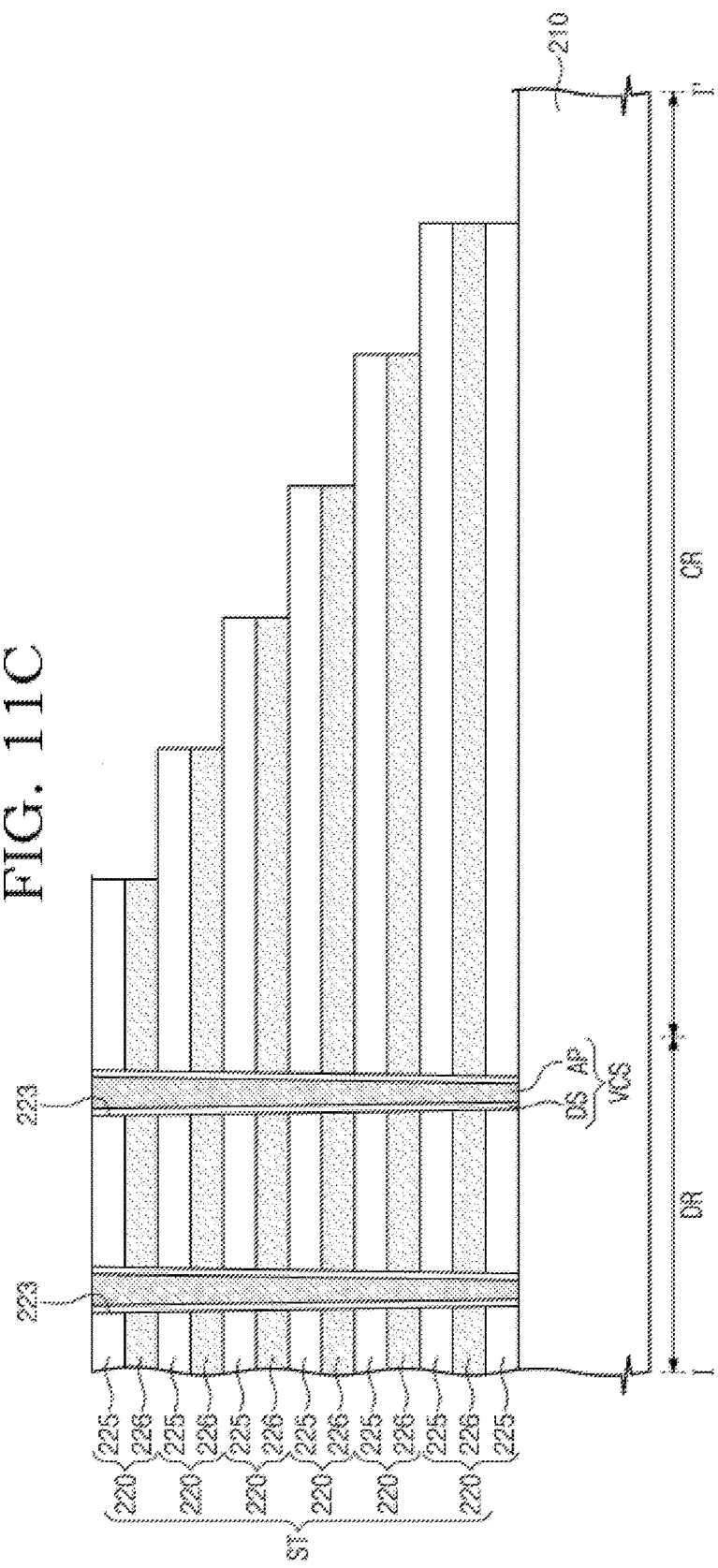

In FIGS. 11B and 11C, the vertical holes 223 and channel structures vcs may be formed before depositing the first interlayer dielectric 230 and the second interlayer dielectric 232. Alternatively, the first interlayer dielectric 230 may be deposited before forming the vertical holes 223 and channel structures vcs. Then, the second interlayer dielectric 232 may be deposited after forming the channel structures vcs.

In FIG. 11D, the first interlayer dielectric 230 and the second interlayer dielectric 232 may be formed and the stacked structure may be planarized similar to the method described in FIGS. 7C to 7E above. After FIG. 11D, the method may proceed according to the same operations described in FIGS. 7H to 7M.

In semiconductor devices according to example embodiments of inventive concepts, cusping may be reduced and/or not formed at an interlayer dielectric. Thus, a semiconductor device with improved reliability may be provided.

According to a method for fabricating a semiconductor device of inventive concepts, an interlayer dielectric may include a first interlayer dielectric and a second interlayer dielectric. The first interlayer dielectric may have a stepwise shape including step portions where an angle formed by a top surface and a side surface is an obtuse angle, because the first interlayer dielectric is formed using the deposition process with a low side step coverage. Thus, cusping may be limited (and/or prevented) from being formed when the second interlayer dielectric is formed on the first interlayer dielectric. Furthermore, a defect such as a crack may be limited (and/or prevented) from being formed at the interlayer dielectric. As a result, a method for fabricating a semiconductor device with improved reliability and yield may be provided.

The above-disclosed subject matter is to be considered illustrative, and not restrictive, and the appended claims are intended to cover all such modifications, enhancements, and other features, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description. While some example embodiments have been particularly shown and described, it will be understood by one of ordinary skill in the art that variations in form and detail may be made therein without departing from the spirit and scope of the claims.

What is claimed is:

1. A method for fabricating a semiconductor device, comprising:
   forming a stacked structure on a substrate, the stacked structure including a stepwise shape;
   forming a first interlayer dielectric covering the stacked structure,
      the first interlayer dielectric including at least one step portion having a sloped surface connecting a first top surface to a second top surface,
      the first top surface and the sloped surface defining a first angle that is an obtuse angle, and a level of the second top surface being higher than a level of the first top surface; and forming a second interlayer dielectric covering the first interlayer dielectric.

2. The method as set forth in claim 1, wherein
the forming the stacked structure includes forming a plurality of step layers on the substrate,
the forming the plurality of step layers includes forming at least a first step layer and a second step layer stacked sequentially,
the first step layer includes an end portion exposed by the second step layer,
the second step layer includes a side surface adjacent to the end portion of the first step layer,
a second angle is defined by a top surface of the end portion of the first step layer and the side surface of the second step layer, and
the second angle is smaller than the first angle.

3. The method as set forth in claim 2, wherein the second angle is between 85 and 95 degrees.

4. The method as set forth in claim 2, wherein the sloped surface horizontally corresponds to the side surface of the second step layer.

5. The method as set forth in claim 2, further comprising:
forming a vertical channel structure penetrating the first step layer and the second step layer on a device region of the substrate, wherein
the substrate includes the device region and a connection region,
the forming the plurality of step layers includes forming the first step layer and the second step layer on the device region and the connection region, and
the forming the stacked structure includes forming the stacked structure so the stepwise shape is on the connection region.

6. The method as set forth in claim 5, further comprising:
forming a first contact; and
forming a second contact, wherein
the forming the plurality of step layers includes forming the first step layer by sequentially stacking a first electrode and a first electrode insulating layer,
the forming the plurality of step layers includes forming the second step layer by sequentially stacking a second electrode and a second electrode insulating layer,
the forming the first contact includes electrically connecting the first contact to the first electrode by forming the first contact to penetrate the first interlayer dielectric, the second interlayer dielectric, and the first electrode insulating layer on the connection region, and
the forming the second contact includes electrically connecting the second contact to the second electrode by forming the second contact to penetrate the first inter layer dielectric, the second interlayer dielectric, and the second electrode insulating layer on the connection region.

7. The method as set forth in claim 1, wherein the first top surface and the second top surface are sloped with respect to a top surface of the substrate.

8. The method as set forth in claim 1, wherein
the first angle is between 100 and 150 degrees.

9. A method for fabricating a semiconductor device, comprising:
forming a stacked structure on a substrate, the stacked structure including a stepwise shape and including a plurality of step layers;

forming a first interlayer dielectric covering the stacked structure using a deposition process with a side step coverage of greater than 0 percent and less than or equal to 50 percent; and
forming a second interlayer dielectric covering the first interlayer dielectric.

10. The method as set forth in claim 9, wherein
the forming the first interlayer dielectric includes performing a high-density plasma chemical vapor deposition process using silane ($SiH_4$) gas.

11. The method as set forth in claim 9, wherein the forming the second interlayer dielectric includes performing a deposition process with a higher side step coverage than that of the deposition process used to form the first interlayer dielectric.

12. The method as set forth in claim 11, wherein
the forming the second interlayer dielectric includes performing a plasma enhanced chemical vapor deposition process using tetraethoxysilane (TEOS) gas.

13. The method as set forth in claim 9, wherein
the first interlayer dielectric includes at least one step portion having a sloped surface connecting a first top surface to a second top surface,
a level of the second top surface is higher than a level of the first top surface, and
the first top surface and the sloped surface define a first angle that is between 100 and 150 degrees.

14. The method as set forth in claim 13, wherein
the substrate includes a device region and a connection region,
the forming the stacked structure includes,
sequentially forming a first step layer and a second step layer on the substrate,
forming the stepwise shape by removing a portion of the second step layer on the connection region and exposing a portion of a top surface of the first step layer, and
forming vertical channel structures penetrating the plurality of step layers on the device region, and
the exposed top surface of the first step layer and a side surface of the second step layer define a second angle that is between 85 and 95 degrees.

15. The method as set forth in claim 14, further comprising:
forming a first and a second contact hole;
forming a first and a second contact, wherein
the forming first step layer includes forming a first electrode and a first electrode insulating layer stacked sequentially,
the forming the second step layer includes forming a second electrode and a second electrode insulating layer stacked sequentially,
forming the first contact hole and the second contact hole includes,
forming the first contact hole through the first interlayer dielectric, the second interlayer dielectric, and the first electrode insulating layer to expose a top surface of the first electrode on the connection region, and
forming the second contact hole through the first interlayer dielectric, the second interlayer dielectric, and the second electrode insulating layer to expose a top surface of the second electrode on the connection region, and
the forming the first contact and the second contact includes filling the first contact hole and the second contact hole with the first contact and the second contact, respectively.

16. A method for fabricating a semiconductor device, comprising:
  forming a stacked structure on a substrate,
    the stacked structure including a plurality of step layers stacked on top of each other,
    an end of the stacked structure having a stepwise shape defined by the step layers extending farther parallel to the substrate as the step layers become closer to the substrate; and
  forming a plurality of interlayer dielectrics on the stacked structure,
    the forming the plurality of interlayer dielectrics including forming a first interlayer dielectric covering at least the end of the stacked structure and having a first side step coverage over the end of the stacked structure,
    the forming the plurality of interlayer dielectrics including forming a second interlayer dielectric covering at least the first interlayer dielectric and the end of the stacked structure,
    the second interlayer dielectric having a second side step coverage over the end of the stacked structure that is greater than the first side step coverage.

17. The method as set forth in claim 16, wherein
  the forming the first interlayer dielectric includes performing a high-density plasma chemical vapor deposition process using silane ($SiH_4$) gas.

18. The method as set forth in claim 16, wherein the forming the second interlayer dielectric includes performing a plasma enhanced chemical vapor deposition process using tetraethoxysilane (TEOS) gas.

19. The method as set forth in claim 16, wherein
  the first interlayer dielectric includes at least one step portion having a sloped surface of the first interlayer dielectric connecting a first top surface of the first interlayer dielectric to a second top surface of the first interlayer dielectric,
  a level of the second top surface is higher than a level of the first top surface, and
  the first top surface and the sloped surface define a first angle that is between 100 and 150 degrees.

20. The method as set forth in claim 16, further comprising:
  forming one or more vertical channel structures penetrating the step layers on a device region of the substrate; and
  forming bit lines connected to the one or more vertical channel structures, wherein
  the substrate includes the device region and a connection region,
  the forming the stacked structure includes forming the stacked structure so the end of the stacked structure having the stepwise shape is on the connection region,
  the step layers each include an electrode layer on an electrode insulating layer,
  each of the vertical channel structures includes an active pillar surrounded by a data storage layer, and
  the data storage layer extends between the active pillar and the step layers.

* * * * *